US012757780B2

(12) United States Patent
Lin et al.

(10) Patent No.: US 12,757,780 B2
(45) Date of Patent: Oct. 6, 2026

(54) SEMICONDUCTOR PACKAGE WITH STACKED DIES AND THERMAL SUBSTRATE ENCAPSULATION

(71) Applicant: Taiwan Semiconductor Manufacturing Company, Ltd., Hsinchu (TW)

(72) Inventors: Yu-Hung Lin, Taichung City (TW); Shih-Peng Tai, Hsinchu County (TW); Kuo-Chung Yee, Taoyuan City (TW); Chen-Hua Yu, Hsinchu City (TW); Wei-Ming Wang, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 780 days.

(21) Appl. No.: 17/746,990

(22) Filed: May 18, 2022

(65) Prior Publication Data

US 2023/0402340 A1 Dec. 14, 2023

(51) Int. Cl.
*H01L 23/522* (2006.01)
*H01L 23/48* (2006.01)
(Continued)

(52) U.S. Cl.
CPC ....... *H10W 74/121* (2026.01); *H10W 40/228* (2026.01); *H10W 40/253* (2026.01);
(Continued)

(58) Field of Classification Search
CPC ............. H01L 23/3135; H01L 23/3677; H01L 23/3738; H01L 24/08; H01L 24/09; H01L 25/0657; H01L 24/80; H01L 25/0652; H01L 25/105; H01L 2224/08145; H01L 2924/37001; H01L 2224/08146; H01L 23/3128; H01L 23/36; H01L 25/18; H01L 25/50; H01L 2224/08221; H01L 2224/09519; H01L 2224/80895;
(Continued)

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |

(Continued)

*Primary Examiner* — Leonard Chang
*Assistant Examiner* — Tsz K Chiu
(74) *Attorney, Agent, or Firm* — JCIPRNET

(57) ABSTRACT

A semiconductor device including a first semiconductor die, a second semiconductor die, thermal silicon substrates and an encapsulation is provided. The second semiconductor die is disposed on and electrically connected to the first semiconductor die. The thermal silicon substrates are disposed on the first semiconductor die, wherein the thermal silicon substrates are spaced apart from the second semiconductor die. The encapsulation is disposed on the first semiconductor die. The encapsulation encapsulates the second semiconductor die and the thermal silicon substrates. The encapsulation includes a filling material layer and an insulator, wherein the filling material layer is disposed on the first semiconductor die and located between the second semiconductor die and thermal silicon substrates, and the filling material layer is spaced apart from the second semiconductor die and the thermal silicon substrates by the insulator.

20 Claims, 43 Drawing Sheets

(51) Int. Cl.
*H01L 23/528* (2006.01)
*H01L 23/532* (2006.01)
*H10W 40/22* (2026.01)
*H10W 40/25* (2026.01)
*H10W 74/10* (2026.01)
*H10W 90/00* (2026.01)
*H10W 70/60* (2026.01)
*H10W 72/90* (2026.01)
*H10W 74/01* (2026.01)
*H10W 74/15* (2026.01)
*H10W 80/00* (2026.01)
*H10W 90/20* (2026.01)

(52) U.S. Cl.
CPC ............ *H10W 90/00* (2026.01); *H10W 70/60* (2026.01); *H10W 72/965* (2026.01); *H10W 72/967* (2026.01); *H10W 74/012* (2026.01); *H10W 74/15* (2026.01); *H10W 80/312* (2026.01); *H10W 80/327* (2026.01); *H10W 90/20* (2026.01); *H10W 90/288* (2026.01); *H10W 90/297* (2026.01); *H10W 90/722* (2026.01); *H10W 90/791* (2026.01); *H10W 90/792* (2026.01)

(58) Field of Classification Search
CPC . H01L 2224/80896; H01L 2225/06524; H01L 2225/06541; H01L 2225/06589; H01L 2225/1023; H01L 2225/1058; H01L 2225/1094; H01L 2924/1431; H01L 2924/1434; F28F 2215/00; H10W 90/00; H10W 90/722; H10W 90/724; H10W 74/117; H10W 70/60; H10W 70/611; H10W 90/701; H10W 70/635; H10W 90/734; H10W 74/15; H10W 74/019; H10W 70/09; H10W 90/297; H10W 40/22; H10W 70/614; H10W 72/0198; H10W 72/073; H10W 70/65; H10W 70/685; H10W 90/288; H10W 72/874; H10W 74/014; H10W 72/072; H10W 74/142; H10W 90/732; H10W 90/401; H10W 74/01; H10W 70/05; H10W 72/241; H10W 72/9413; H10W 74/00; H10W 72/877; H10W 20/20; H10W 72/252; H10W 72/29; H10W 90/20; H10W 72/90; H10W 70/093; H10W 72/20; H10W 70/099; H10W 74/114; H10W 72/884; H10W 74/016; H10W 40/228; H10W 40/70; H10W 74/012; H10W 70/095; H10W 72/07254; H10W 72/247; H10W 99/00; H10W 74/10; H10W 90/754; H10W 74/111; H10W 90/792; H10W 90/291; H10W 40/10; H10W 72/823; H10W 74/121; H10W 90/736; H10W 20/42; H10W 42/121; H10W 90/28; H10W 72/354; H10W 70/6528; H10W 72/07207; H10W 72/952; H10W 74/129; H10W 40/258; H10W 40/778; H10W 70/655; H10W 76/12; H10W 70/63; H10W 72/244; H10W 72/853; H10W 80/00; H10W 80/312; H10W 90/22; H10W 95/00; H10W 72/944; H10W 40/037; H10W 72/30; H10W 72/942; H10W 80/327; H10W 72/00; H10W 72/951; H10W 74/141; H10W 20/023; H10W 20/0245; H10W 72/07236; H10W 72/353; H10W 72/923; H10W 72/9415; H10W 70/698; H10W 42/00; H10W 70/68; H10W 72/50; H10W 76/40; H10W 42/20; H10W 80/211; H10W 40/47; H10W 72/071; H10W 72/222; H10W 76/60; H10W 90/794; H10W 20/40; H10W 70/618; H10W 72/07307; H10W 72/07354; H10W 72/325; H10W 72/352; H10W 72/851; H10W 72/856; H10W 72/01; H10W 72/225; H10W 72/253; H10W 72/347; H10W 74/131; H10W 90/24; H10W 40/73; H10W 76/15; H10W 80/743; H10W 90/10; H10W 90/271; H10W 20/2134; H10W 40/253; H10W 40/40; H10W 40/77; H10W 46/00; H10W 46/301; H10W 70/481; H10W 72/07331; H10W 74/137; H10W 90/752; H10W 40/611; H10W 44/20; H10W 70/02; H10W 72/019; H10W 72/07252; H10W 74/473; H10W 20/435; H10W 70/652; H10W 70/6523; H10W 72/01225; H10W 72/227; H10W 72/387; H10W 72/941; H10W 76/63; H10W 90/728; H10W 90/811; H10W 40/00; H10W 40/251; H10W 40/255; H10W 40/30; H10W 40/60; H10W 70/461; H10W 72/012; H10W 72/07253; H10W 72/07339; H10W 72/237; H10W 72/265; H10W 72/267; H10W 72/879; H10W 74/127; H10W 76/01; H10W 76/05; H10W 76/10; H10W 76/153; H10W 90/756; H10W 90/791; H10W 20/01; H10W 20/056; H10W 20/43; H10W 40/226; H10W 40/25; H10W 42/276; H10W 42/80; H10W 44/248; H10W 44/501; H10W 44/601; H10W 70/69; H10W 70/695; H10W 72/01935; H10W 72/07336; H10W 72/075; H10W 72/242; H10W 72/965; H10W 72/967; H10W 74/47; H10W 76/47; H10W 90/721; H10W 20/0249; H10W 20/083; H10W 20/47; H10W 20/484; H10W 40/259; H10W 70/04; H10W 70/041; H10W 70/411; H10W 70/451; H10W 70/682; H10W 72/07251; H10W 72/07304; H10W 72/07323; H10W 72/07337; H10W 72/07338; H10W 72/07554; H10W 72/248; H10W 72/5445; H10W 72/5522; H10W 72/801; H10W 72/926; H10W 72/9445; H10W 72/953; H10W 72/983; H10W 76/18; H10W 80/301; H10W 90/26; H10W 90/726; H10W 90/753; H10W 20/045; H10W 20/0698; H10W 20/081; H10W 20/425; H10W 20/49; H10W 40/235; H10W 40/242; H10W 40/613; H10W 42/273; H10W 42/60; H10W 46/101; H10W 46/607; H10W 70/042; H10W 70/092; H10W 70/20; H10W 70/40; H10W 70/417; H10W 70/429; H10W 70/641; H10W 70/692; H10W 72/01515; H10W 72/0711; H10W 72/07231; H10W 72/07302; H10W 72/221; H10W 72/381; H10W 72/925; H10W 72/932; H10W 72/934; H10W 74/147; H10W 74/40; H10W 76/17;

H10W 76/42; H10W 80/016; H10W 80/338; H10W 90/733; H10W 90/739; H10W 20/0234; H10W 20/0242; H10W 20/0253; H10W 20/043; H10W 20/062; H10W 20/063; H10W 20/427; H10W 20/44; H10W 20/481; H10W 20/493; H10W 20/497; H10W 40/254; H10W 40/43; H10W 40/735; H10W 70/098; H10W 70/421; H10W 70/424; H10W 70/427; H10W 70/435; H10W 70/438; H10W 70/442; H10W 70/458; H10W 70/464; H10W 70/466; H10W 70/467; H10W 70/468; H10W 70/479; H10W 70/656; H10W 70/657; H10W 70/658; H10W 70/66; H10W 70/681; H10W 70/687; H10W 72/01204; H10W 72/01212; H10W 72/01223; H10W 72/01235; H10W 72/013; H10W 72/01351; H10W 72/01951; H10W 72/07131; H10W 72/07204; H10W 72/07232; H10W 72/07235; H10W 72/07311; H10W 72/07332; H10W 72/07352; H10W 72/07541; H10W 72/07552; H10W 72/076; H10W 72/228; H10W 72/234; H10W 72/251; H10W 72/321; H10W 72/344; H10W 72/351; H10W 72/521; H10W 72/522; H10W 72/5366; H10W 72/552; H10W 72/5524; H10W 72/5525; H10W 72/834; H10W 72/859; H10W 72/981; H10W 74/017; H10W 74/124; H10W 74/476; H10W 76/138; H10W 76/157; H10W 76/45; H10W 78/00; H10W 80/102; H10W 80/314; H10W 80/721; H10W 90/293; H10W 90/725; H10W 90/738

See application file for complete search history.

(56) References Cited

U.S. PATENT DOCUMENTS

| | | | | |
|---|---|---|---|---|
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 9,583,415 | B2 * | 2/2017 | Yu | H01L 23/36 |
| 10,510,629 | B2 * | 12/2019 | Chen | H01L 23/367 |
| 2007/0023889 | A1 * | 2/2007 | Salmon | G02B 6/43 257/E23.072 |
| 2008/0230922 | A1 * | 9/2008 | Mochizuki | H01L 25/0655 257/E21.507 |
| 2019/0164860 | A1 * | 5/2019 | Lin | H01L 23/481 |
| 2020/0185330 | A1 * | 6/2020 | Yu | H01L 24/24 |
| 2020/0381397 | A1 * | 12/2020 | Yu | H01L 24/08 |
| 2021/0082894 | A1 * | 3/2021 | Chen | H01L 24/73 |
| 2021/0098381 | A1 * | 4/2021 | Yu | H01L 23/42 |

* cited by examiner

SEMICONDUCTOR PACKAGE WITH STACKED DIES AND THERMAL SUBSTRATE ENCAPSULATION

BACKGROUND

Three-dimensional (3D) integrated circuit (3DIC) solutions, such as System on Integrated Chips (SoIC), has been developed to integrate various chips (e.g., active and passive chips) into a new integrated SoC system to meet ever-increasing market demands on higher computing efficiency, wilder data bandwidth, higher functionality packaging density, lower communication latency, and lower energy consumption per bit data. 3D packaging has some challenges—thermal, power delivery, and yield. The SoIC enables the heterogeneous integration of known good dies (KGDs) with different chip sizes, functionalities and wafer node technologies, all to be integrated in a single, compact new system chip. As SoIC is fabricated using wafer fabrication processes, it can be holistically integrated into variant back-end advanced packaging technology platforms such as flip chip, integrated fan-out (InFO) and Chip-on-Wafer-on-Substrate (CoWoS) to provide a miniaturized and highly integrated heterogeneous integration system in package (SiP) for the future HPC, AI, 5G, and edge computing applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
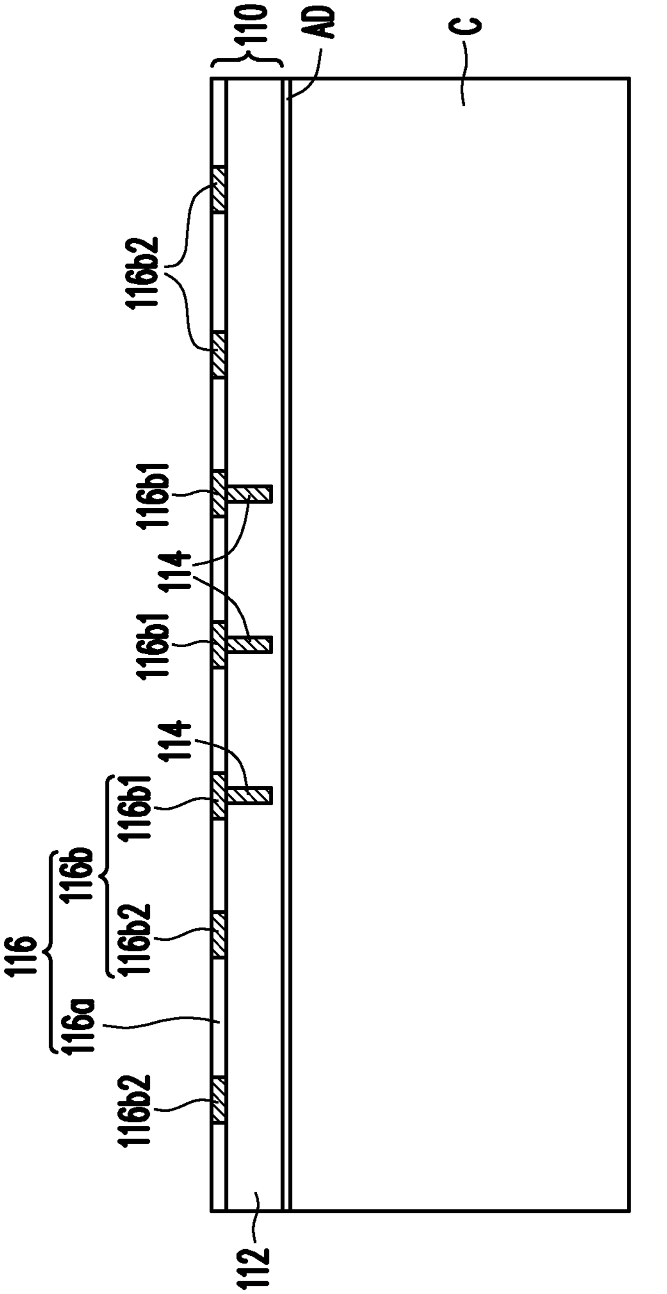
FIG. 1 through FIG. 12 are cross-sectional views schematically illustrating a process flow for fabricating SoIC structures in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 110%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g., a composition which is "substantially free" from Y may be completely free from Y.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1 through FIG. 12 are cross-sectional views schematically illustrating a process flow for fabricating SoIC structures in accordance with some embodiments of the present disclosure.

Referring to FIG. 1, a semiconductor wafer 110 (e.g., a logic integrated circuit wafer) is provided and attached to a carrier C. In some embodiments, the semiconductor wafer 110 is attached to the carrier C through an adhesion layer AD. In some embodiments, the carrier C includes silicon substrate, quartz substrate, ceramic substrate, glass substrate, a combination thereof, or the like, and provides mechanical support for subsequent operations performed on the semiconductor wafer 110. In some embodiments, the adhesion layer AD includes a light to heat conversion (LTHC) material, an UV adhesive, a polymer layer, a combination thereof, or the like, and the adhesion layer AD is formed through a spin-on coating process, a printing process, a lamination process, a combination thereof, or the like.

In some embodiments, the semiconductor wafer 110 includes a semiconductor substrate 112 formed in or on the semiconductor substrate 112 and an interconnect structure (not individually shown) disposed on the semiconductor substrate 112. The semiconductor substrate 112 may be formed of silicon, although it may also be formed of other group III, group IV, and/or group V elements, such as germanium, gallium, arsenic, and combinations thereof. The semiconductor substrate 112 may also be in the form of silicon-on-insulator (SOI). The SOI substrate may include a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like. In some embodiments, the semiconductor wafer 110 further includes one or more active and/or passive devices (not individually shown) formed on or in the semiconductor substrate 112. The one or more active and/or passive devices may include various n-type metal-oxide semiconductor (NMOS) and/or p-type metal-oxide semiconductor (PMOS) devices such as transistors, capacitors, resistors, diodes, photo-diodes, fuses and/or the like.

The interconnect structure may include stacked dielectric layers (such an inter-layer dielectric (ILD)/inter-metal dielectric layers (IMDs)) and interconnect wirings (such as conductive lines and vias) between in the stacked dielectric layers. The stacked dielectric layers may be formed of a low-K dielectric material, such as phosphosilicate glass (PSG), borophosphosilicate glass (BPSG), FSG, SiOxCy, Spin-On-Glass (SOG), Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. In some embodiments, the interconnect wirings may be formed in the stacked dielectric layers using, for example, a damascene process, a dual damascene process, a combination thereof, or the like. In some embodiments, the interconnect wirings include copper wirings, silver wirings, gold wirings, tungsten wirings, tantalum wirings, aluminum wirings, a combination thereof, or the like. In some embodiments, the interconnect wirings provide electrical connections between the one or more active and/or passive devices formed on the substrate.

In some embodiments, the semiconductor wafer 110 further includes conductive through vias 114 (e.g., copper through vias) embedded in the semiconductor wafer 112. In some embodiments, the conductive through vias 114 may be formed by forming through holes in the semiconductor wafer 110 and filling the through holes with suitable conductive materials. In some embodiments, the through holes are formed using suitable photolithography and etching methods. In some embodiments, the through holes are filled with copper, a copper alloy, silver, gold, tungsten, tantalum, aluminum, a combination thereof, or the like, using physical vapor deposition (PVD), atomic layer deposition (ALD), electro-chemical plating, electroless plating, or a combination thereof, the like. In some embodiments, a liner layer and/or an adhesive/barrier layer may be formed in the through holes before filling the through holes with suitable conductive materials. In some embodiments, a planarization process may be performed to remove excess portions of the conductive material (i.e., excess conductive material located outside the through holes). The planarization process may include a chemical mechanical polishing (CMP) process, a grinding process, an etching process, a combination thereof, or the like.

In some embodiments, the semiconductor wafer 110 further includes a bonding structure 116 disposed on the interconnect structure. The bonding structure 116 may include a bonding dielectric layer **116*a* and bonding conductors 116*b* embedded in the bonding dielectric layer 116*a*. The bonding conductors 116*b* may include signal transmission conductors 116*b*1 and heat dissipation conductors 116*b*2. The signal transmission conductors 116*b*1 are electrically connected to the active and/or passive devices (not individually shown) formed on or in the semiconductor substrate 112 through the interconnect structure. The heat dissipation conductors 116*b*2 are electrically floated or grounded. As illustrated in FIG. 1, the top surfaces of the signal transmission conductors 116*b*1 and the heat dissipation conductors 116*b*2 are substantially level with the top surface of the bonding dielectric layer 116*a*. In some embodiments, the bonding dielectric layer 116*a* includes silicon oxide (e.g., TEOS formed oxide), silicon nitride, silicon oxynitride, or the like. In some embodiments, the bonding conductors 116*b*** include conductive vias (e.g., copper vias), conductive pads (e.g., copper pads) or combinations thereof.

Figure 2:
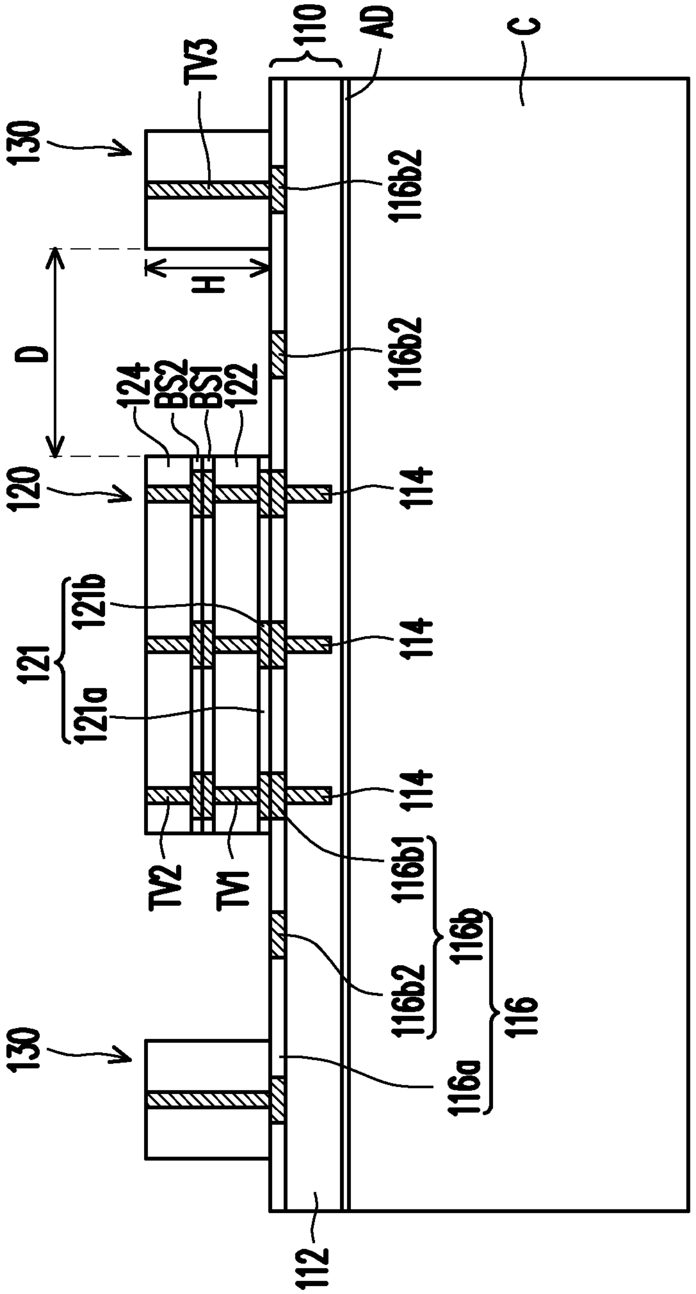

Referring to FIG. 2, at least one semiconductor die 120 having a height H greater than 20 micrometers is bonded with the semiconductor wafer 110 through a Chip-on-Wafer (CoW) process. In some embodiments, the semiconductor die 120 includes stacked memory dies and the overall height H of the stacked memory dies is greater than 20 micrometers. The semiconductor die 120 may include a High-Bandwidth-Memory (HBM) cube including stacked HBM memory dies and a controller die for controlling operation of the stacked HBM memory dies, and the controller die is stacked over the stacked HBM memory dies. In some embodiments, the semiconductor die 120 includes a bonding structure 121 in contact with the bonding structure 116. The bonding structure 121 may include a bonding dielectric layer **121*a* and bonding conductors 121*b* embedded in the bonding dielectric layer 121*a*. The bonding conductors 121*b* (i.e., signal transmission conductors) are in contact with and electrically connected to the signal transmission conductors 116*b*1 of the bonding structure 116. The bonding dielectric layer 121*a* is in contact with and bonded to the bonding dielectric layer 116*a* of the bonding structure 116. In some embodiments, the bonding dielectric layer 121*a* includes silicon oxide (e.g., TEOS formed oxide), silicon nitride, silicon oxynitride, or the like. In some embodiments, the bonding conductor 121*b* include conductive vias (e.g., copper vias), conductive pads (e.g., copper pads) or combinations thereof. The bonding between the semiconductor wafer 110 and the semiconductor die 120 includes dielectric-to-dielectric bonding as well as conductor-to-conductor bonding (e.g., metal-to-metal bonding). The conductor-to-conductor bonding between the bonding conductors 116*b* and the bonding conductors 122*b*** may be via-to-via bonding, pad-to-pad bonding or via-to-pad bonding.

In some alternative embodiments, the semiconductor die 120 may be or include a System-on-Chip (SoC) die. In some other embodiment, the semiconductor die 120 may be or include stacked memory dies, such as DRAM dies, SRAM dies, RRAM dies, MRAM dies and so on.

As illustrated in FIG. 2, the semiconductor die 120 includes at least on bottom tier semiconductor die 122 and a top tier semiconductor die 124 covering the at least on bottom tier semiconductor die 122, wherein the at least one bottom tier semiconductor die 122 may be or include a HBM cube, and the top tier semiconductor die 124 may be or includes a controller die. The at least on bottom tier semiconductor die 122 includes a bonding structure BS1 and conductive through vias TV1, and the top tier semiconductor die 124 includes a bonding structure BS2 and conductive through vias TV2. The at least on bottom tier semiconductor die 122 is bonded with and electrically connected to the top tier semiconductor die 124 through the bonding structures BS1 and BS2. The bonding structures BS1 and BS2 are similar to the above-mentioned bonding structure 121 and the detailed descriptions of the bonding structures BS1 and BS2 are thus omitted.

Thermal silicon substrates 130 (e.g., dummy semiconductor dies) are picked and placed on the bonding structure 116 of the semiconductor wafer 110, wherein the thermal silicon substrates 130 are laterally spaced apart from the semiconductor die 120 by a minimum distance D ranging from about 10 micrometers to about 200 micrometers, the height H of the semiconductor die 120 ranges from about 3 micrometers to about 650 micrometers, and the ratio of the height H of the semiconductor die 120 to the minimum distance D between the semiconductor die 120 and the thermal silicon substrates 130 ranges from about 0.015 to about 20. The thermal silicon substrates 130 may be disposed to cover portions of the heat dissipation conductors **116*b*2, and the semiconductor die 120 is laterally surrounded by the thermal silicon substrates 130. In some embodiments, the thermal silicon substrates 130 may include thermal vias TV3 (e.g., copper thermal vias) in contact with and thermally coupled to the heat dissipation conductors 116*b*2. The thermal vias TV3 in the thermal silicon substrates 130 are electrically floated or grounded. As illustrated in FIG. 2, the height of the thermal silicon substrates 130 may be substantially equal to the height H of the semiconductor die 120. In some other embodiments, the height of the thermal silicon substrates 130 may be different from (e.g., greater than or less than) the height H of the semiconductor die 120**.

Figure 3:
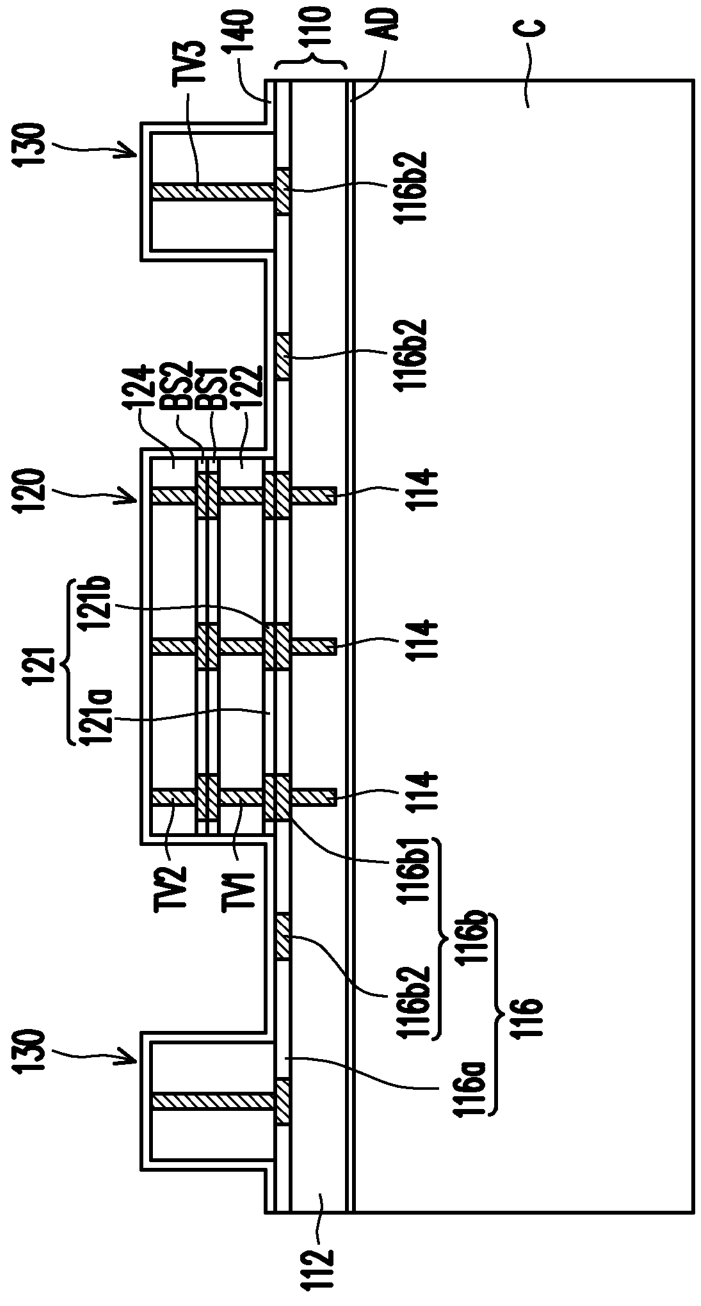

Referring to FIG. 3, an insulating layer 140 is formed over the bonding structure 116 of the semiconductor wafer 110 to conformally cover the semiconductor die 120 as well as the thermal silicon substrates 130. The insulating layer 140 covers sidewalls of the semiconductor die 120, sidewalls of the thermal silicon substrates 130 and portions of the bonding structure 116 which are not covered by the semiconductor die 120 and the thermal silicon substrates 130. As illustrated in FIG. 3, the insulating layer 140 is in contact with the conductive through vias TV2 in the top tier semiconductor die 124 and the thermal vias TV3 in the thermal silicon substrates 130. Furthermore, the insulating layer 140 is in contact with portions of the heat dissipation conductors **116*b*2 which are not covered by the semiconductor die 120 and the thermal silicon substrates 130. The insulating layer 140** may be formed of dielectric material, such as silicon nitride, silicon dioxide, silicon oxynitride, combinations thereof, or the like, by any suitable method known in the art, such as chemical vapor deposition (CVD), plasma enhanced CVD (PECVD), a combination thereof, or the like.

Figure 4:
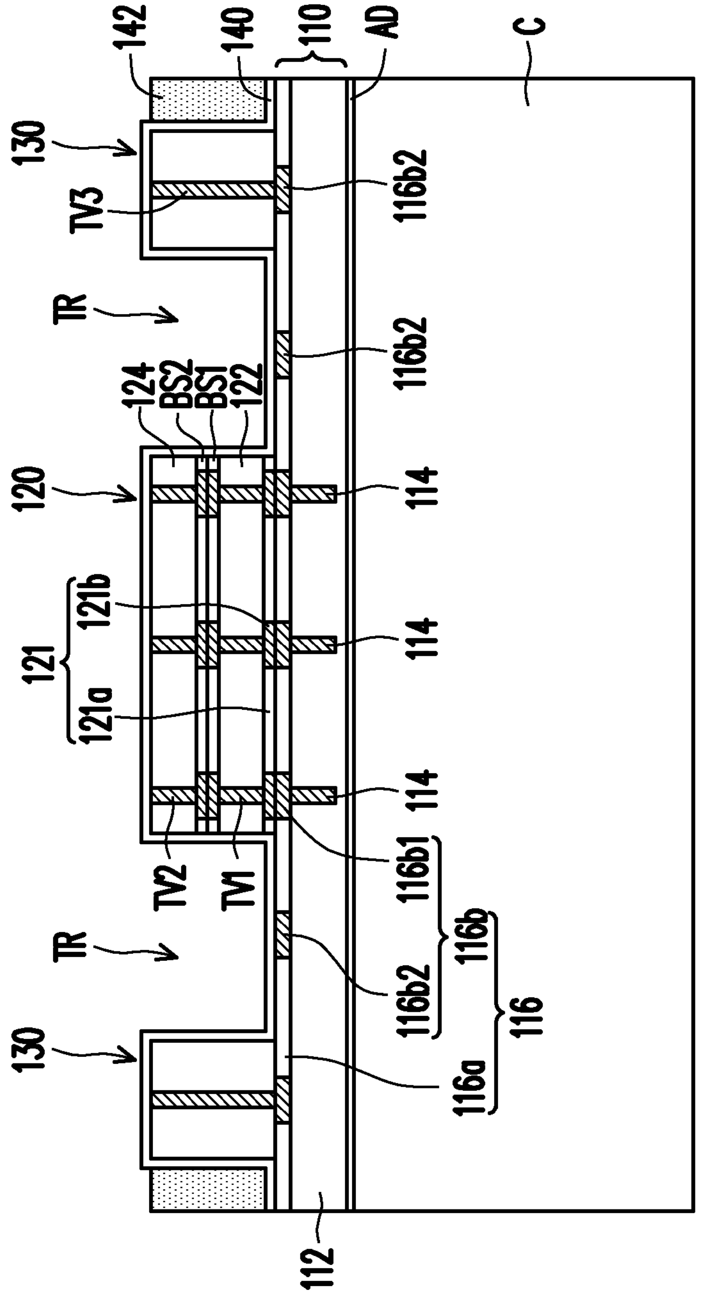

Referring to FIG. 4, a patterned dielectric filling material 142 is formed over the insulating layer 140 to fill gaps between adjacent thermal silicon substrates 130. Portions of sidewalls of the thermal silicon substrates 130 which face the semiconductor die 120 are not covered by the ring-shaped patterned dielectric filling material 142. The patterned dielectric filling material 142 is spaced apart from the thermal silicon substrates 130 by portions of the insulating layer 140 which cover the sidewalls of the thermal silicon substrates 130. The top surface of the patterned dielectric filling material 142 may substantially level with the top surface of the semiconductor die 120 and the top surfaces of the thermal silicon substrates 130. The material of the patterned dielectric filling material 142 may be or include negative photoresist, such as photosensitive polyimide, photosensitive undoped silicate glass (USG) or the like. The patterned dielectric filling material 142 may be formed by high density plasma chemical vapor deposition (HDP-CVD), sub-atmosphere chemical vapor deposition (SACVD) or other deposition processes followed by a photolithography process. In some other embodiments, the material of the patterned dielectric filling material 142 may be or include non-photosensitive polyimide or the like.

Figure 41:
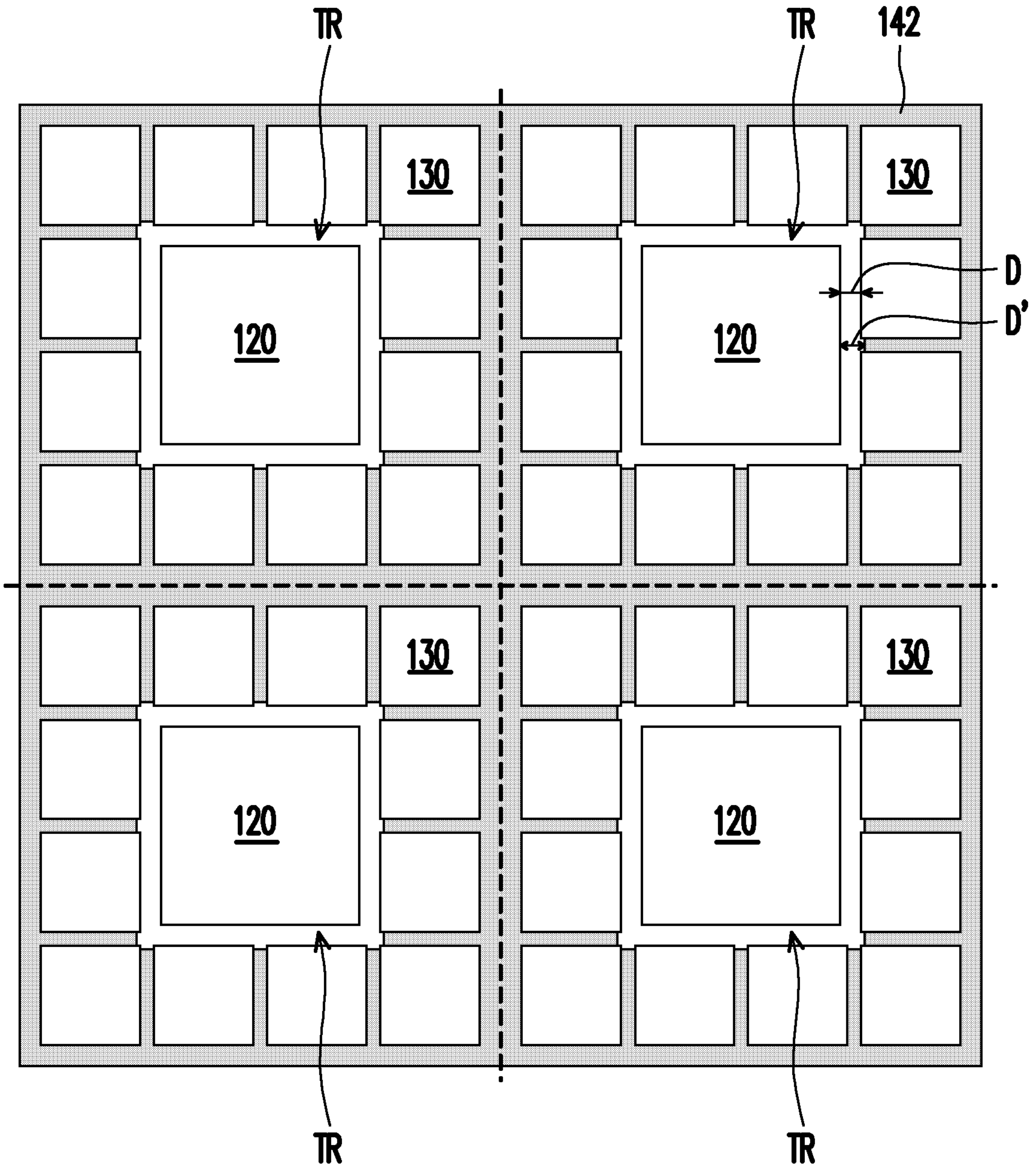
FIG. 41 is a top view illustrating the ring-shaped trench TR, the semiconductor die 120, the thermal silicon substrates 130 and the patterned dielectric filling material 142 shown in FIG. 4.

As illustrated in FIG. 41, the thermal silicon substrates 130 are classified into multiple groups, each group of thermal silicon substrates may be arranged to surround one semiconductor die 120, and the patterned dielectric filling material 142 may be a ring-shaped patterned dielectric filling material 142 laterally encapsulating the groups of the thermal silicon substrates 130. Each one of the semiconductor dies 120 is laterally surrounded by one group of thermal silicon substrates 130 and the ring-shaped patterned dielectric filling material 142. The ring-shaped patterned dielectric filling material 142 is laterally spaced apart from each semiconductor dies 120 by a ring-shaped trench TR shown in FIG. 41, wherein an inner profile of the ring-shaped trench TR is defined by the sidewalls of the semiconductor die 120, and an outer profile of the ring-shaped trench TR is defined by the sidewalls of the thermal silicon substrates 130 and the patterned dielectric filling material 142.

In some embodiments, as illustrated in FIG. 41, the minimum distance D' between the sidewalls of the semiconductor die 120 and the sidewalls of the patterned dielectric filling material 142 which face the semiconductor die 120 is greater than the minimum distance D between the sidewalls of the semiconductor die 120 and the sidewalls of the thermal silicon substrates 130 which face the semiconductor die 120. In some alternative embodiments, not shown in FIG. 41, the minimum distance between the sidewalls of the semiconductor die 120 and the sidewalls of the patterned dielectric filling material 142 which face the semiconductor die 120 is substantially equal to the minimum distance between the sidewalls of the semiconductor die 120 and the sidewalls of the thermal silicon substrates 130 which face the semiconductor die 120.

Figure 5:
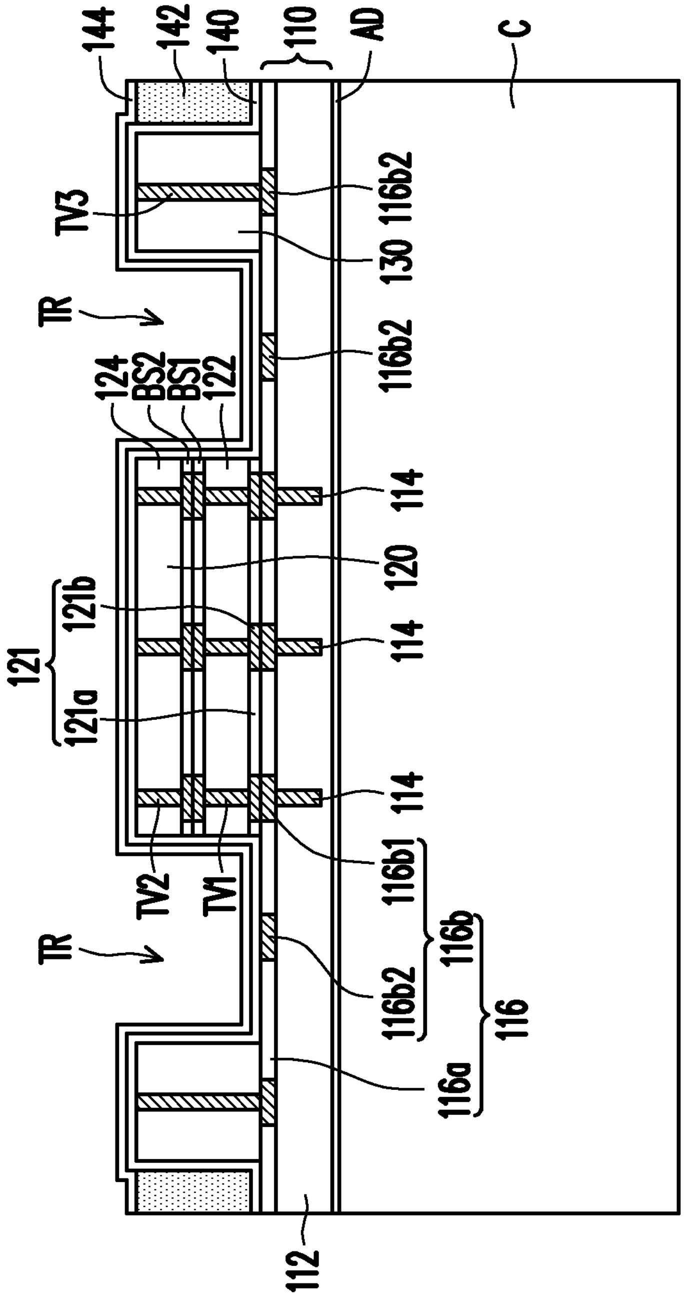

Referring to FIG. 5, after forming the patterned dielectric filling material 142, an insulating layer 144 is formed to cover the patterned dielectric filling material 142 and the insulating layer 140. The insulating layer 144 is in contact with the patterned dielectric filling material 142 and the insulating layer 140. The insulating layer 144 is disposed over the semiconductor 120 and the thermal silicon substrates 130. The insulating layer 144 is spaced apart from the semiconductor 120 and the thermal silicon substrates 130 by the insulating layer 140. The insulating layer 144 may be formed of dielectric material, such as silicon nitride, silicon dioxide, silicon oxynitride, combinations thereof, or the like, by any suitable method known in the art, such as chemical vapor deposition (CVD), plasma enhanced CVD (PECVD), a combination thereof, or the like. The material of the insulating layer 144 may be identical to or different from that of the insulating layer 140.

Figure 6:
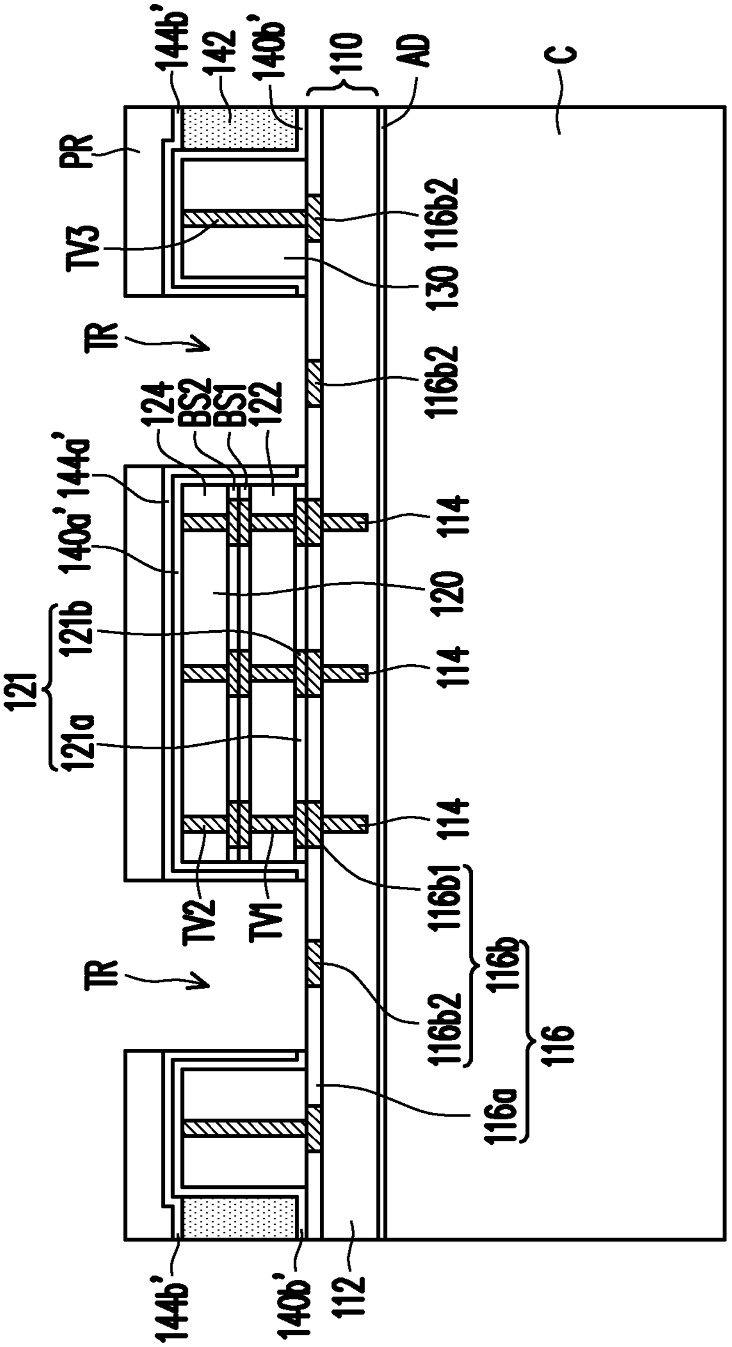

Referring to FIG. 5 and FIG. 6, a patterned photoresist PR is formed on the insulating layer 144. The patterned photoresist PR is located above the semiconductor die 120, the thermal silicon substrates 130, the patterned dielectric filling material 142, portions of the insulating layer 140 and portions of the insulating layer 144. Then, the insulating layer 140 and the insulating layer 144 are patterned by using the patterned photoresist PR as a mask. The insulating layer 140 and the insulating layer 144 may be patterned through an etch process such that a first insulating pattern 140*a*', a second insulating pattern 144*a*', third insulating patterns 140*b*' and fourth insulating patterns 144*b*' are formed. After forming the first insulating pattern 140*a*', the second insulating pattern 144*a*', the third insulating patterns 140*b*' and the fourth insulating patterns 144*b*', portions of the bonding structure 116 of the semiconductor wafer 110 are revealed. The first insulating pattern 140*a*' covers the top surface of the semiconductor die 120, the sidewalls of the semiconductor die 120 and portions of the semiconductor wafer 110 which are in proximity to the semiconductor die 120. The second insulating pattern 144*a*' covers the first insulating pattern 140*a*', and the second insulating pattern 144*a*' is spaced apart from the semiconductor wafer 110 by the first insulating pattern 140*a*'. The third insulating patterns 140*b*' cover the top surfaces of the thermal silicon substrates 130 and the sidewalls of the thermal silicon substrates 130, and the fourth insulating patterns 144*b*' cover portions of the third insulating patterns 140*b*' as well as the patterned dielectric filling material 142.

Figure 7:
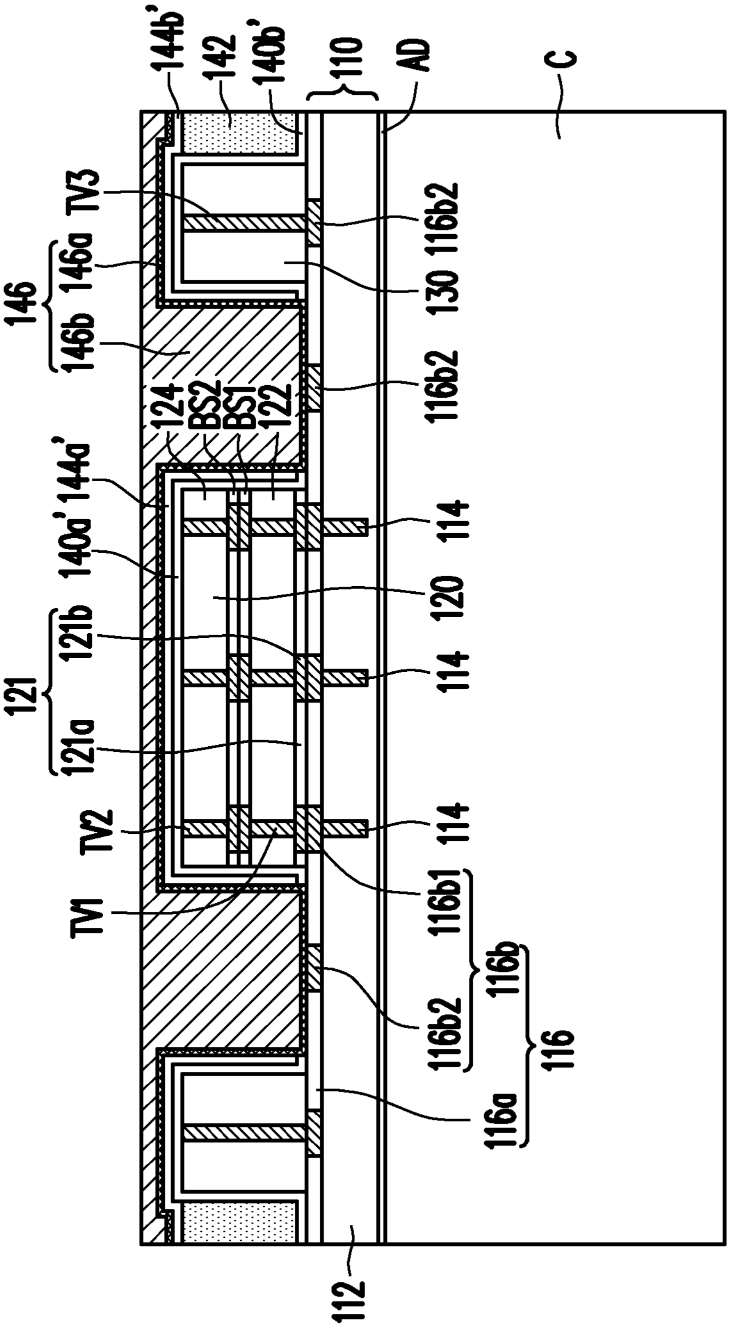

Referring to FIG. 6 and FIG. 7, the patterned photoresist PR is removed from the second insulating pattern 144*a*' and the fourth insulating patterns 144*b*'. Then, a seed layer 146*a* is formed on the second insulating pattern 144*a*', the fourth insulating patterns 144*b*' and the revealed portions of the bonding structure 116. The seed layer 146*a* is deposited on the second insulating pattern 144*a*', the fourth insulating patterns 144*b*' and the revealed portions of the bonding structure 116 through a sputtering process, for example. The seed layer 146*a* may be or include a TiN layer, a TaN layer, a Ti layer, a Ta layer, a Ti/Cu layer or the like. The seed layer 146*a* may function as a barrier layer. After forming the seed layer 146*a*, a conductive layer 146*b* is formed on the seed layer 146*a*. The conductive layer 146*b* is deposited on the seed layer 146*a* through a plating process, for example. The conductive layer 146*b* may be or include a plated copper (Cu) layer, a plated cobalt (Co) layer, a plated ruthenium (Ru) layer or the like.

Figure 8:
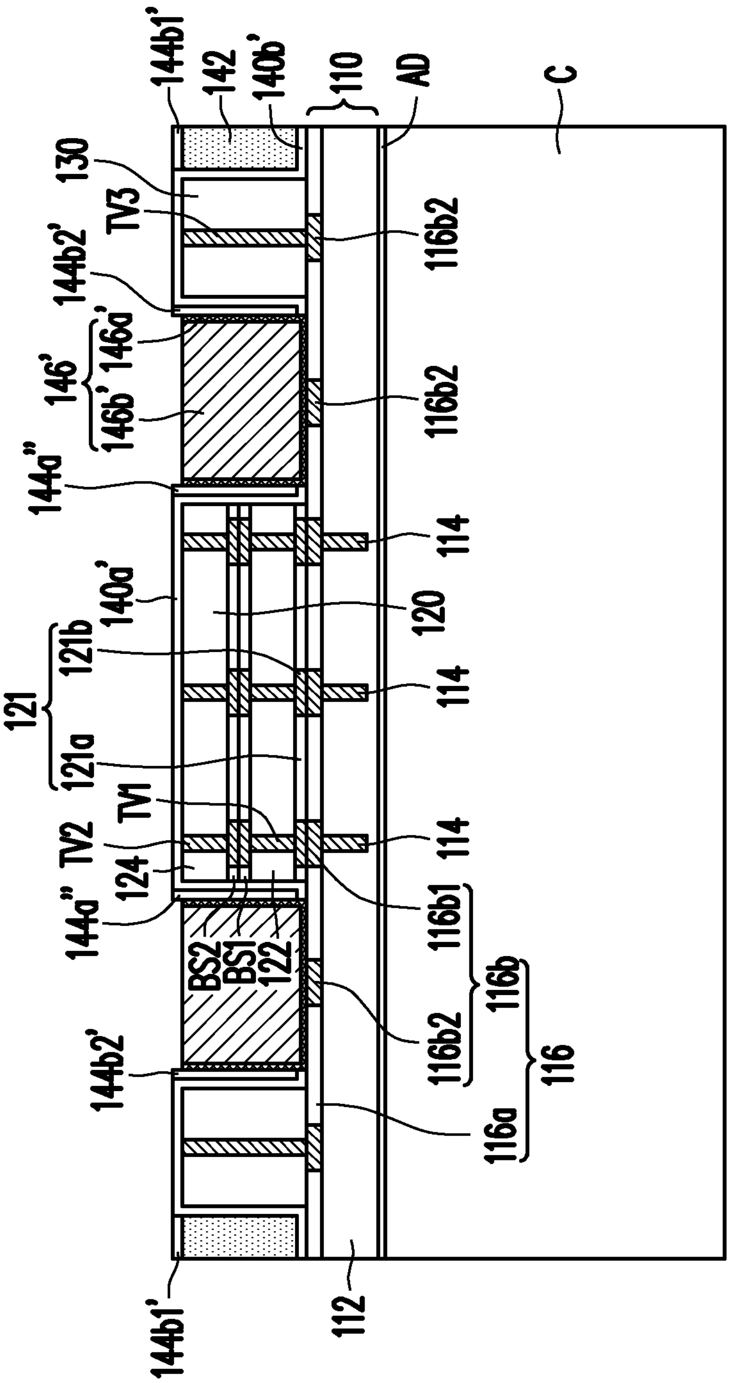

Referring to FIG. 7 and FIG. 8, a removal process is performed to remove portions of the seed layer 146*a* and portions of the conductive layer 146*b* such that a metal layer 146' including a seed pattern 146*a* and a conductive layer 146*b*' is formed between the semiconductor die 120 and the thermal silicon substrates 130. The planarization process may include a chemical mechanical polishing (CMP) process, a grinding process, an etching process, a combination thereof, or the like. In an embodiment where the ratio of the height H of the semiconductor die 120 to the minimum distance D between the semiconductor die 120 and the thermal silicon substrates 130 ranges from about 0.015 to about 20, the metal layer 146' formed between the semiconductor die 120 and the thermal silicon substrates 130 may have smooth top surface for subsequently performed processes (e.g., fabrication processes of a redistribution circuit structure and a bonding structure 154 illustrated in FIG. 9). Furthermore, no void is generated in the metal layer 146' between the semiconductor die 120 and the thermal silicon substrates 130. Accordingly, reliability and yield rate of subsequently performed bonding process may be improved.

During the removal process of the seed layer 146*a* and the conductive layer 146*b*, the second insulating patterns 144*a*' may be removed until a portion of the first insulating pattern 140*a*' is revealed such that insulating patterns 144*a*" are formed. The revealed portions of the first insulating pattern 140*a*' may still cover the top surfaces of the semiconductor die 120. The insulating patterns 144*a*" are located between the first insulating pattern 140*a*' and the metal layer 146'. Furthermore, the top surface of the revealed portion of the first insulating pattern 140*a*' may be substantially level with the top ends of the insulating patterns 144*a*".

During the removal process of the seed layer 146*a* and the conductive layer 146*b*, the fourth insulating patterns 144*b*' may be removed until portions of the third insulating pattern 140*b*' are revealed such that insulating patterns 144*b*1' and insulating patterns 144*b*2' are formed. The revealed portions of the third insulating pattern 140*b*' covers the top surfaces of the thermal silicon substrates 130. The insulating patterns 144*b*1' may still cover the top surface of the patterned dielectric filling material 142, and the insulating patterns 144*b*2' are located between the third insulating pattern 140*b*' and the metal layer 146'. Furthermore, the top surface of the revealed portion of the third insulating pattern 140*b*' may be substantially level with the top surfaces of the insulating patterns 144*b*1' and the top ends of the insulating patterns 144*b*2'.

As illustrated in FIG. 8, after performing the removal process, the top surface of the metal layer 146' may be lower than the revealed top surfaces of the first insulating pattern 140*a*', the top ends of the insulating patterns 144*a*", the revealed top surfaces of the third insulating pattern 140*b*', the top surfaces of the insulating patterns 144*b*1' and the top ends of the insulating patterns 144*b*2'. In some alternative embodiments, after performing the removal process, the top surface of the metal layer 146' may be substantially level with the revealed top surfaces of the first insulating pattern 140*a*', the top ends of the insulating patterns 144*a*", the revealed top surfaces of the third insulating pattern 140*b*', the top surfaces of the insulating patterns 144*b*1' and the top ends of the insulating patterns 144*b*2'.

The sidewalls of the semiconductor die 120 are laterally spaced apart from the metal layer 146' by the first insulating pattern 140*a*' as well as the insulating pattern 144*a*", and the sidewalls of the thermal silicon substrates 130 are laterally spaced apart from the metal layer 146' by the third insulating pattern 140*b*' as well as the insulating patterns 144*b*2'. The metal layer 146' is thermally coupled to portions of the heat dissipation conductors 116*b*2. Furthermore, the metal layer 146' and the portions of the heat dissipation conductors 116*b*2 underlying the metal layer 146' are electrically floated or grounded.

Figure 9:
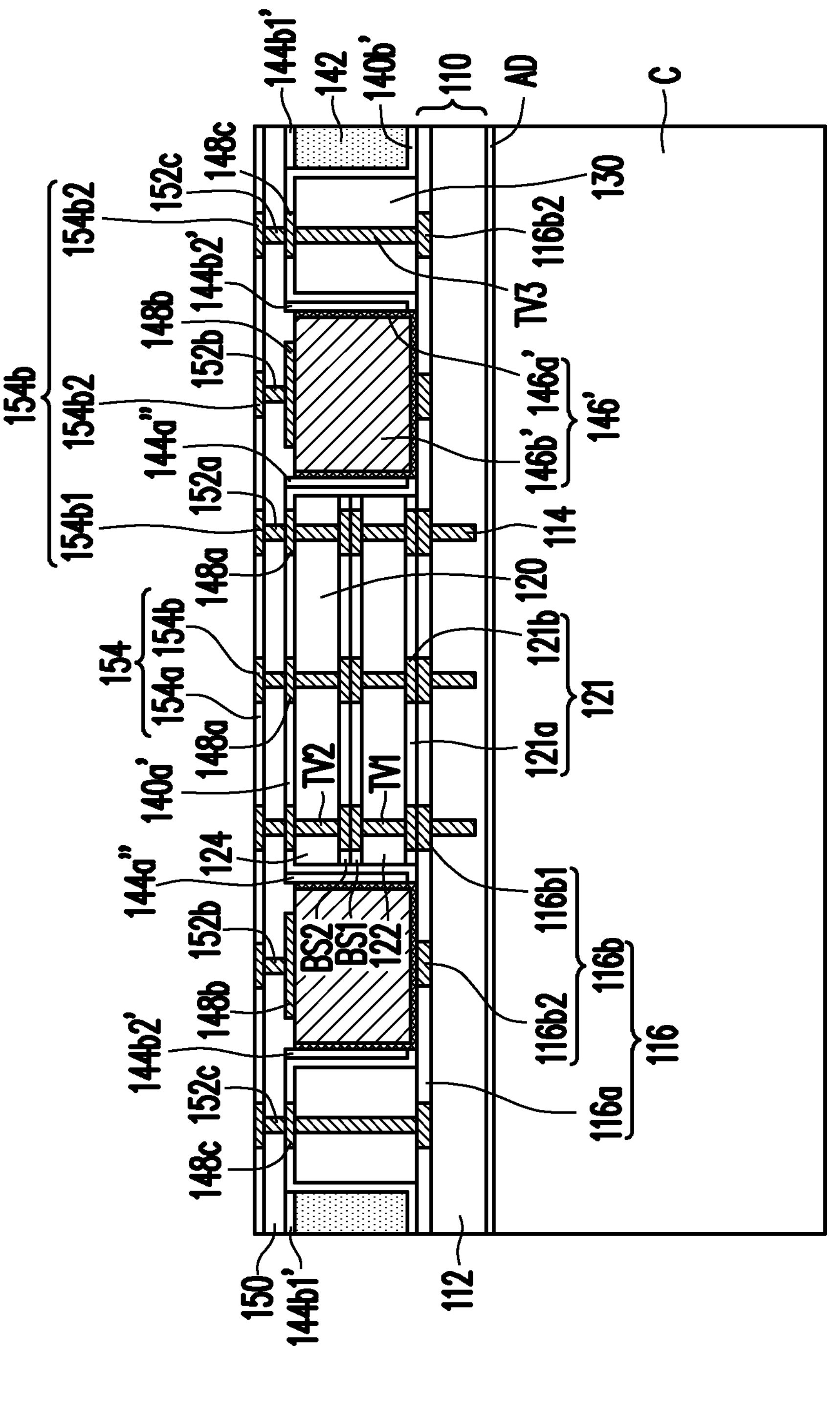

Referring to FIG. 8 and FIG. 9, a redistribution circuit structure including redistribution wirings 148*a*, 148*b* and 148*c*, a dielectric layer 150 and conductive vias 152*a*, 152*b* and 152*c*. The redistribution wirings 148*a*, 148*b* and 148*c* are covered by the dielectric layer 150, and the conductive vias 152*a*, 152*b* and 152*c* are embedded in the dielectric layer 150. The redistribution wirings 148*a*, 148*b* and 148*c* as well as the conductive vias 152*a*, 152*b* and 152*c* may be formed by a deposition process of the dielectric layer 150 followed by a damascene process. However, the fabrication process of the redistribution circuit structure is not limited in the present application.

The redistribution wirings 148*a* and the conductive vias 152*a* are electrically connected to the semiconductor die 120 and provide signal transmission and heat dissipation functions. The redistribution wirings 148*b* as well as the conductive vias 152*b* are thermally coupled to the metal layer 146' and provide heat dissipation function. The redistribution wirings 148*c* as well as the conductive vias 152*c* are thermally coupled to the thermal vias TV3 in the thermal silicon substrates 130 and may provide heat dissipation function.

After forming the redistribution circuit structure, a bonding structure 154 is formed to cover the semiconductor 120, the thermal silicon substrates 130, the metal layer 146' and the patterned dielectric filling material 142. The bonding structure 154 may include a bonding dielectric layer 154*a* and bonding conductors 154*b* embedded in the bonding dielectric layer 154*a*, and the bonding conductors 154*b* includes signal transmission conductors 154*b*1 electrically connected to the conductive vias 152*a* and heat dissipation conductors 154*b*2 thermally coupled to the conductive vias 152*c*. The bonding structure 154 is similar to the above-mentioned bonding structure 121 and the detailed descriptions of the bonding structure 154 are thus omitted.

Figure 10:
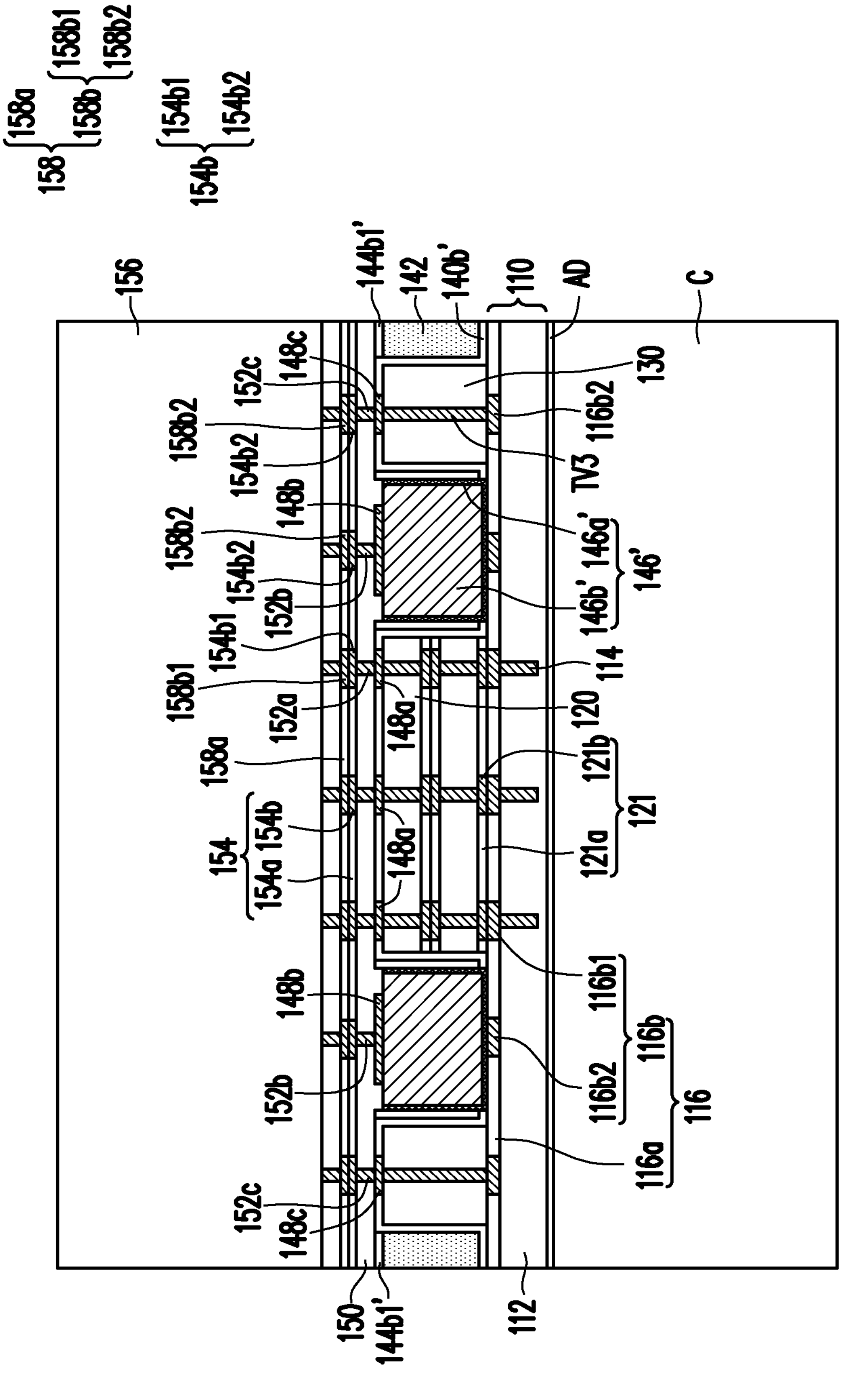

Referring to FIG. 9 and FIG. 10, a support substrate 156 including a bonding structure 158 formed thereon is provided. In some embodiments, the support substrate 156 is a bare silicon wafer and no circuit is formed in the support substrate 156. In some other embodiments, the support substrate 156 is a semiconductor wafer including circuits (e.g., one or more active and/or passive devices) formed therein. The bonding structure 158 formed on the support substrate 156 may include a bonding dielectric layer 158*a* and bonding conductors 158*b* embedded in the bonding dielectric layer 158*a*, and the bonding conductors 158*b* includes signal transmission conductors 158*b*1 electrically connected to the signal transmission conductors 154*b*1 and heat dissipation conductors 158*b*2 thermally coupled to the heat dissipation conductors 154*b*2. The bonding structure 158 is similar to the above-mentioned bonding structure 121 and the detailed descriptions of the bonding structure 158 are thus omitted.

The support substrate 156 is bonded with the bonding structure 154 through the bonding structure 158. The bonding between the bonding structure 154 and the bonding structure 158 includes dielectric-to-dielectric bonding as well as conductor-to-conductor bonding (e.g., metal-to-metal bonding). The conductor-to-conductor bonding between the bonding conductors 154*b* and the bonding conductors 158*b* may be via-to-via bonding, pad-to-pad bonding or via-to-pad bonding. The bonding process of the bonding structure 154 and the bonding structure 158 is a wafer level bonding process. In other words, the support substrate 156 having the bonding structure 158 is bonded with the bonding structure 154 through a Wafer-to-Wafer (WoW) bonding process.

Figure 11:
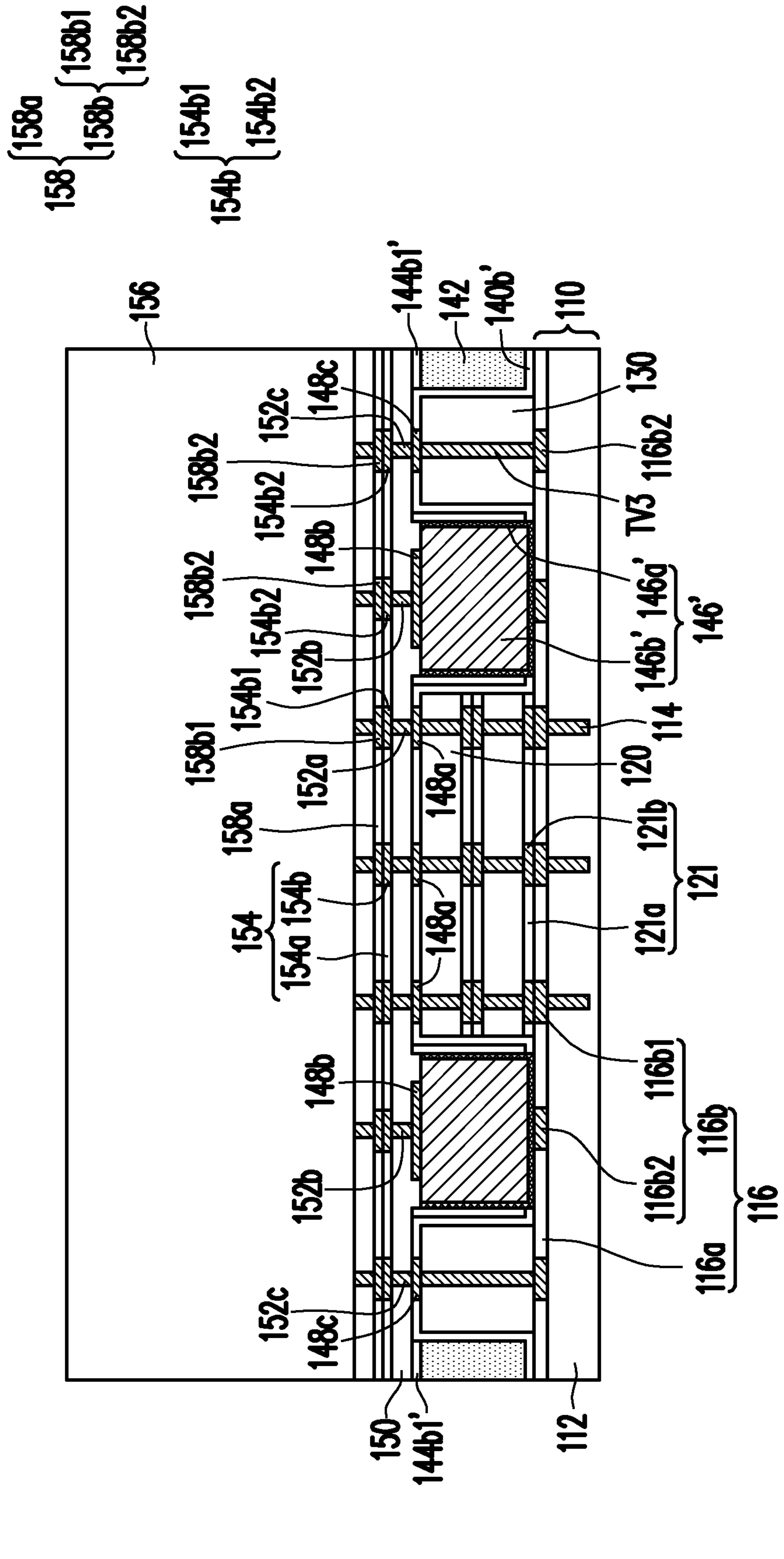

Referring to FIG. 10 and FIG. 11, the carrier C and the adhesion layer AD are de-bonded from the bottom surface of the semiconductor wafer 110. In an embodiment where the adhesion layer AD includes a light to heat conversion (LTHC) material or an UV adhesive, an UV radiation is irradiated on the adhesion layer AD such that the adhesion of the adhesion layer AD reduces and the carrier C can be de-bonded from the bottom surface of the semiconductor wafer 110. In some alternative embodiments, other de-bonding process, such as laser lift-off or the like may be utilized to remove the carrier C and the adhesion layer AD.

Figure 12:
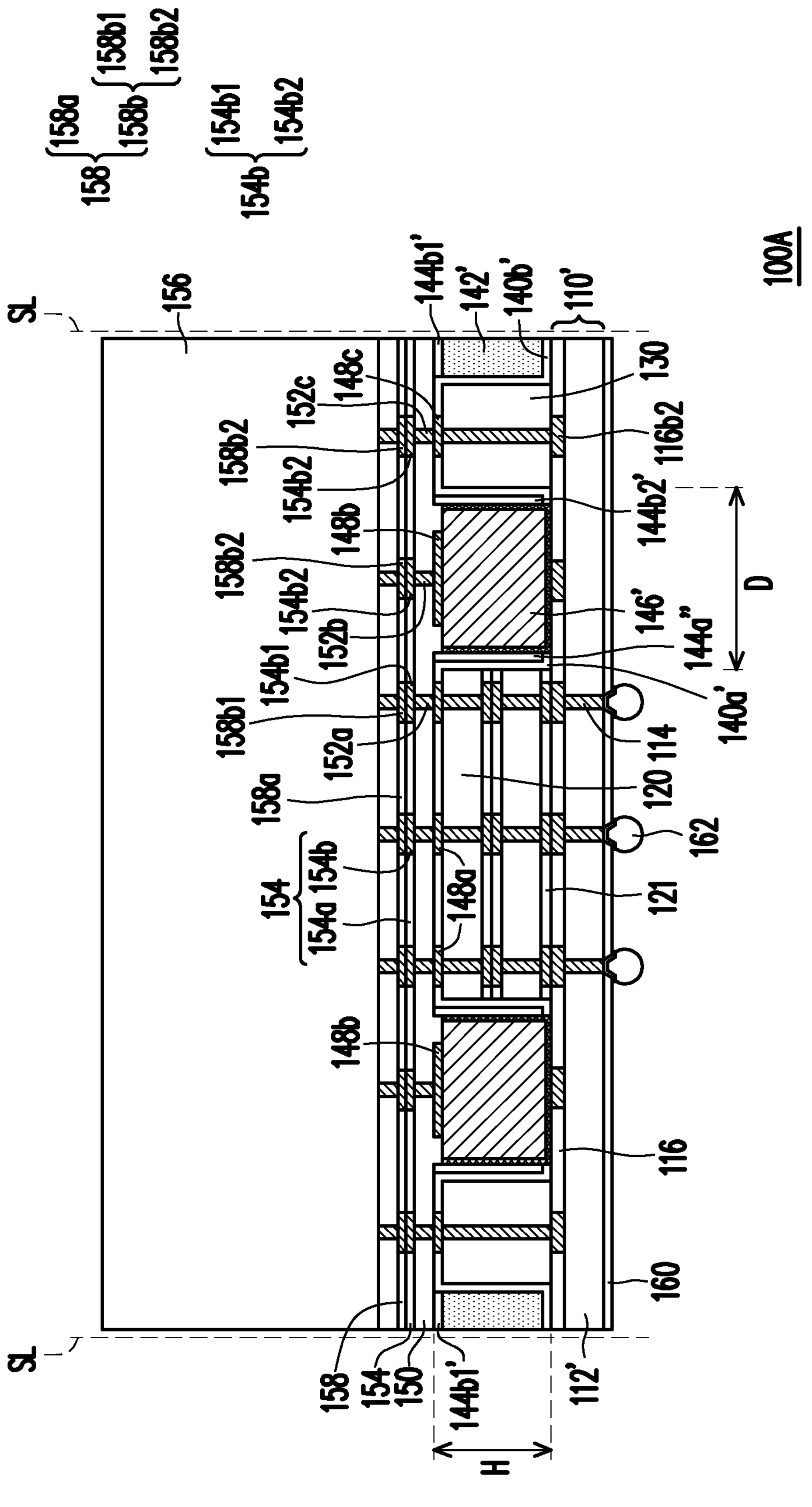
Figure 13:
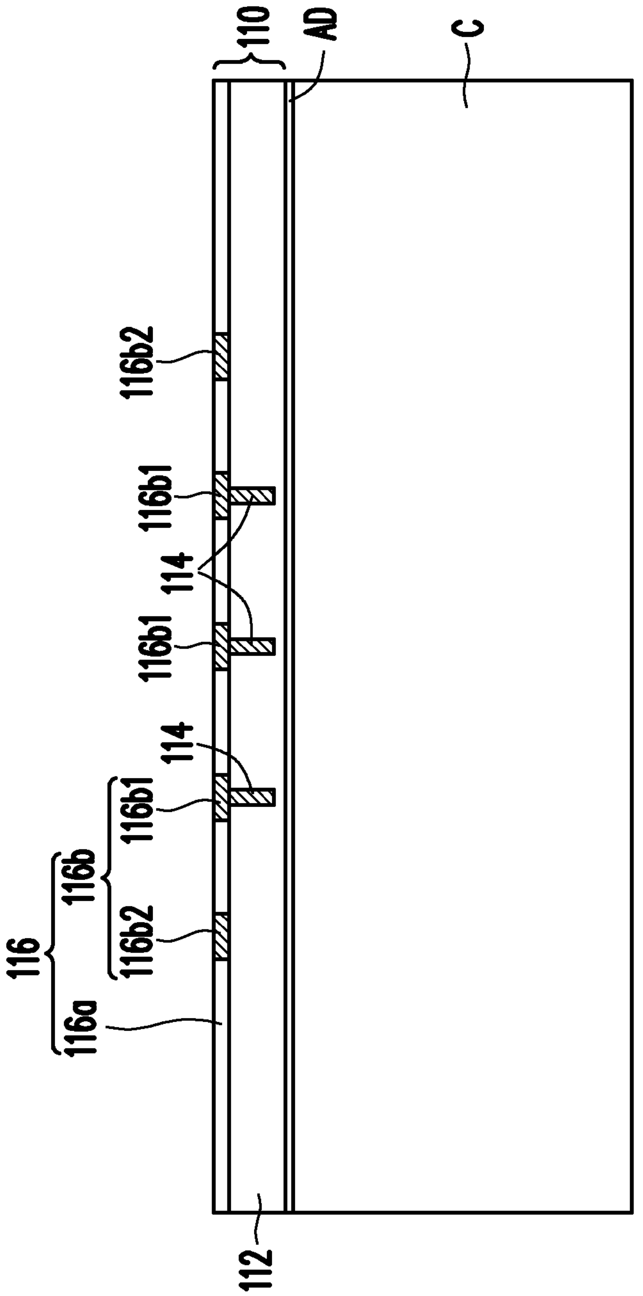
FIG. 13 through FIG. 22 are cross-sectional views schematically illustrating a process flow for fabricating SoIC structures in accordance with some other embodiments of the present disclosure.
Figure 14:
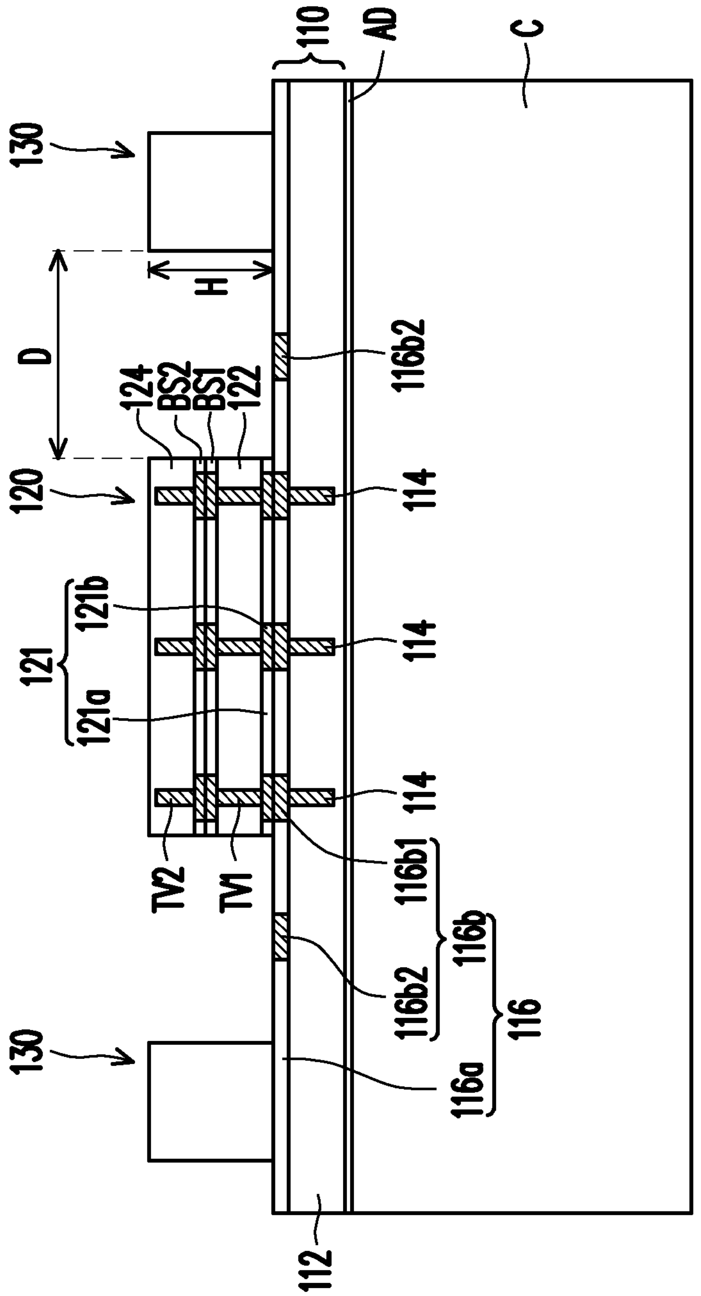
Figure 15:
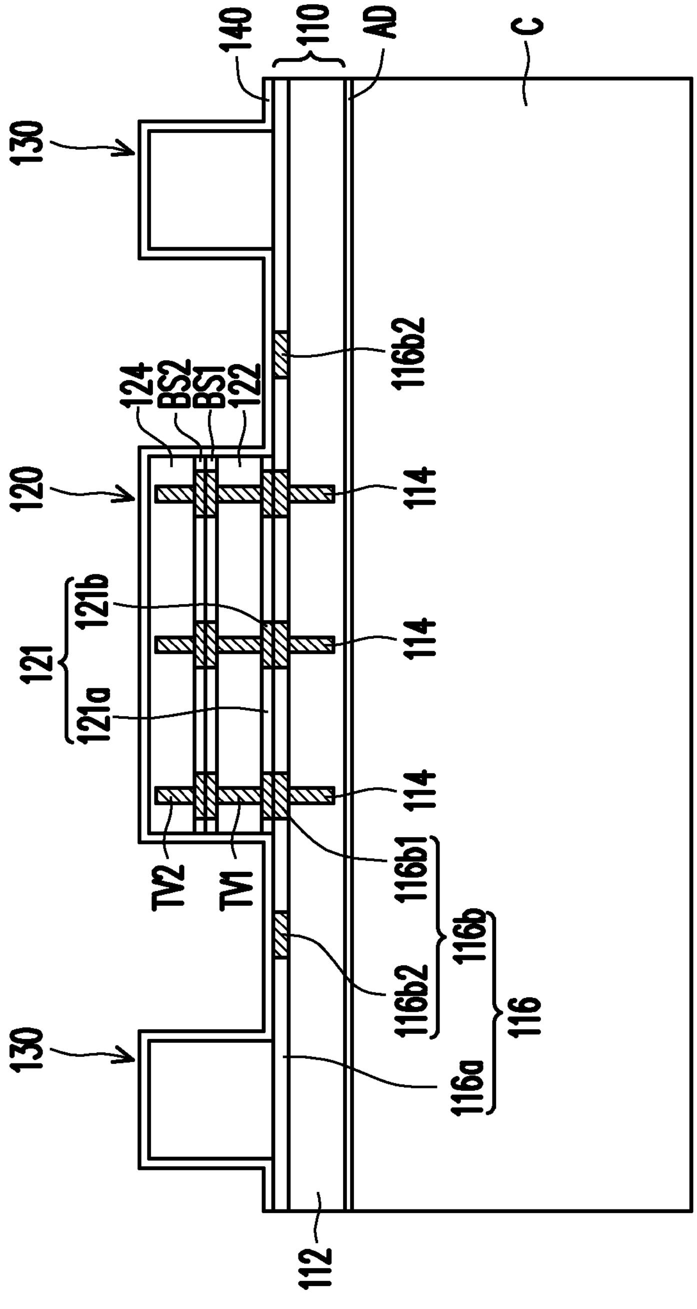
Figure 16:
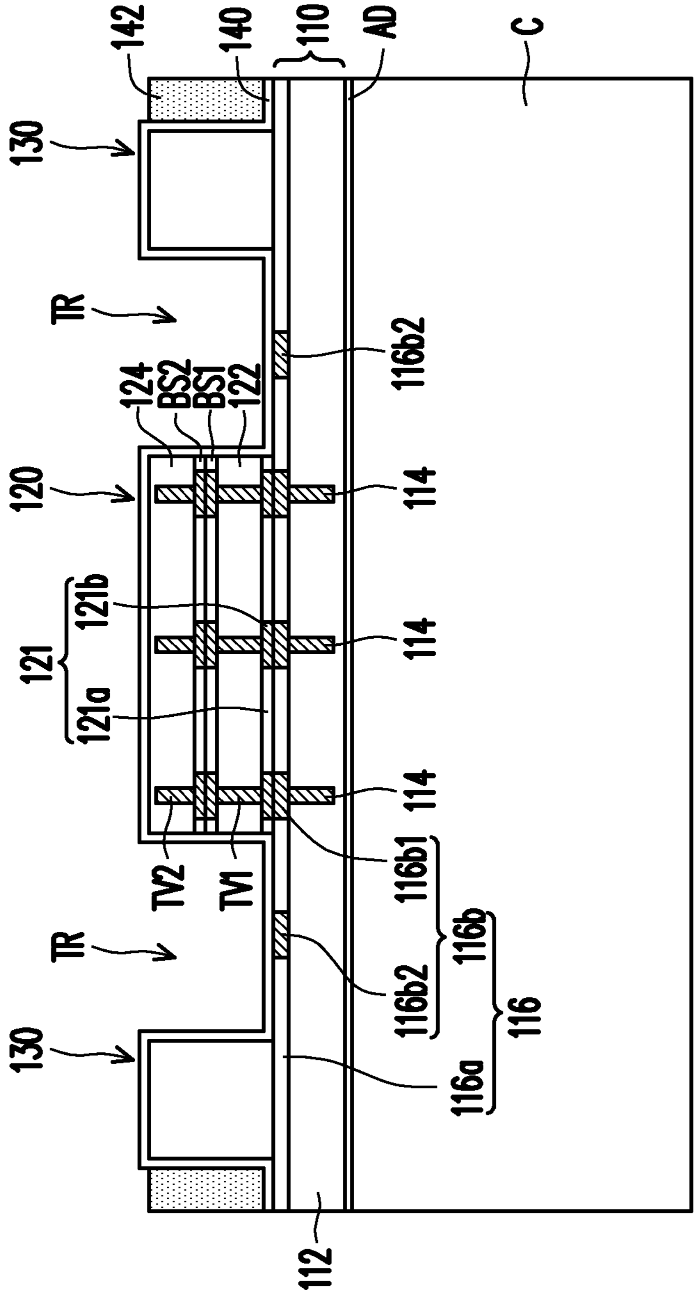
Figure 17:
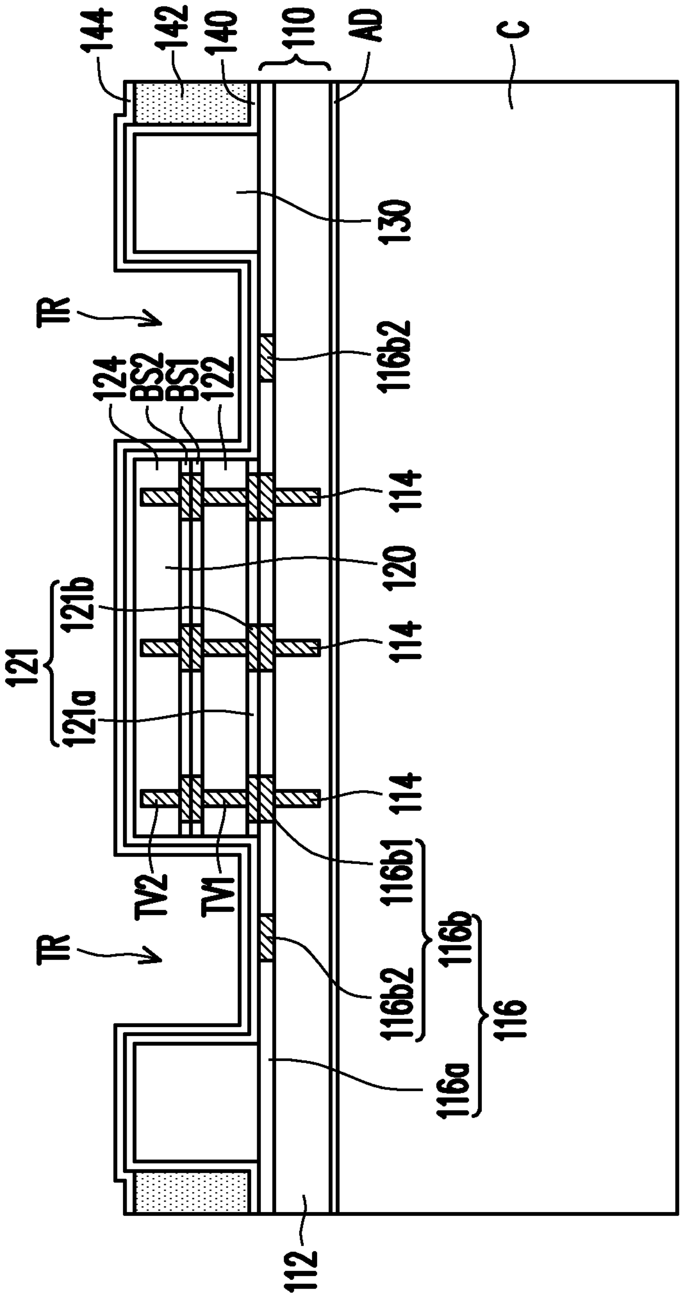
Figure 18:
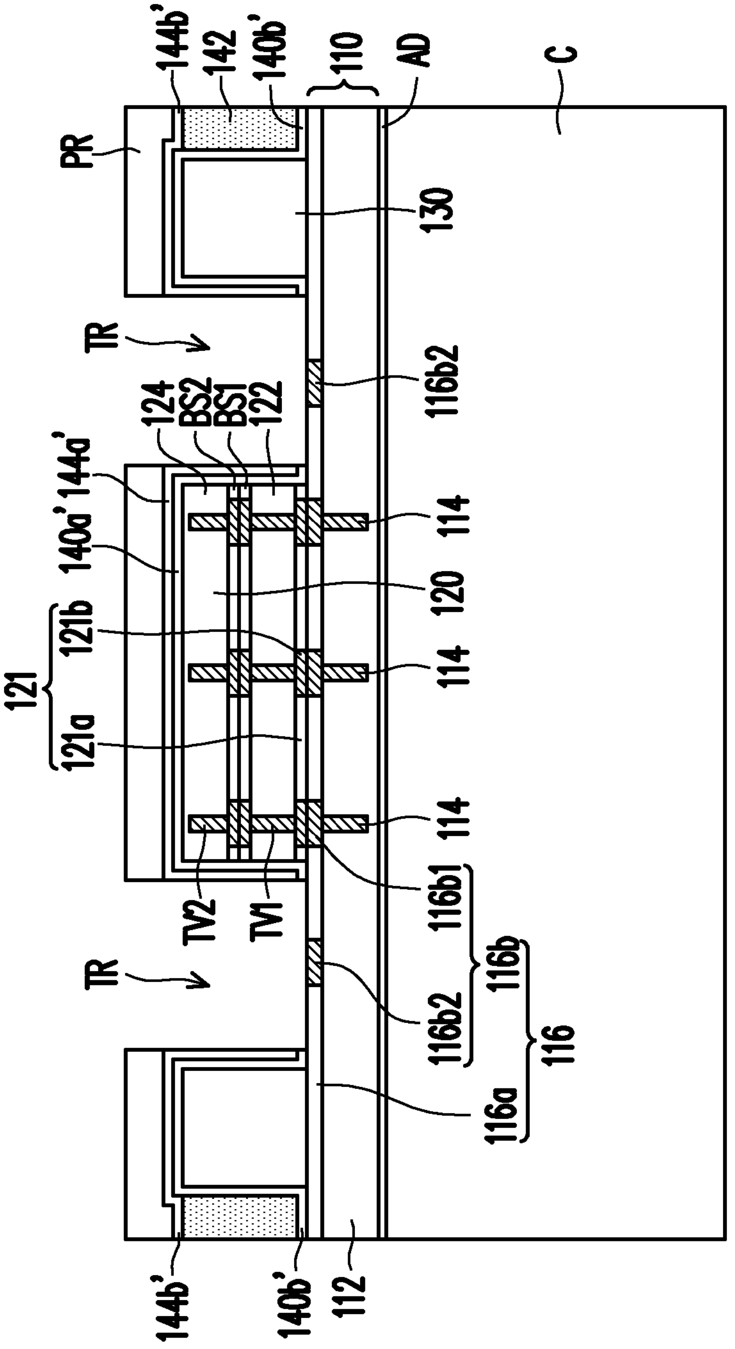
Figure 19:
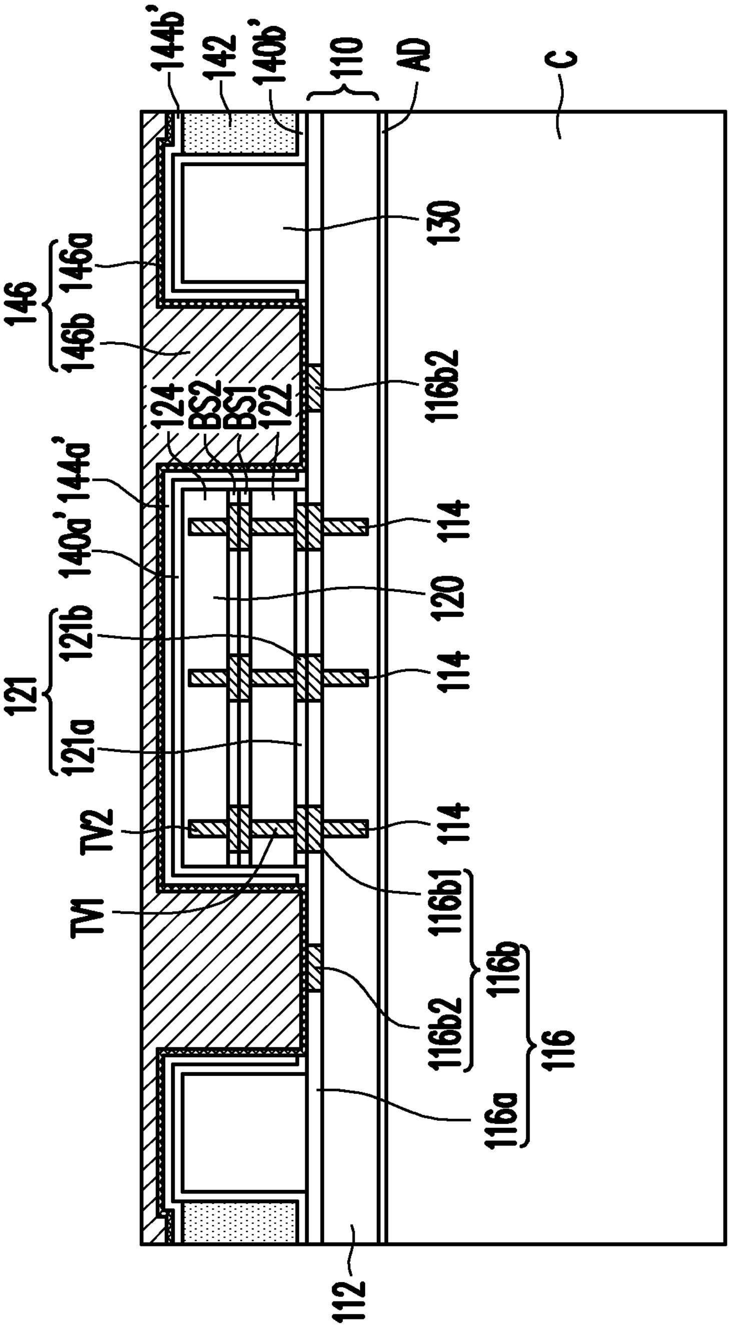
Figure 20:
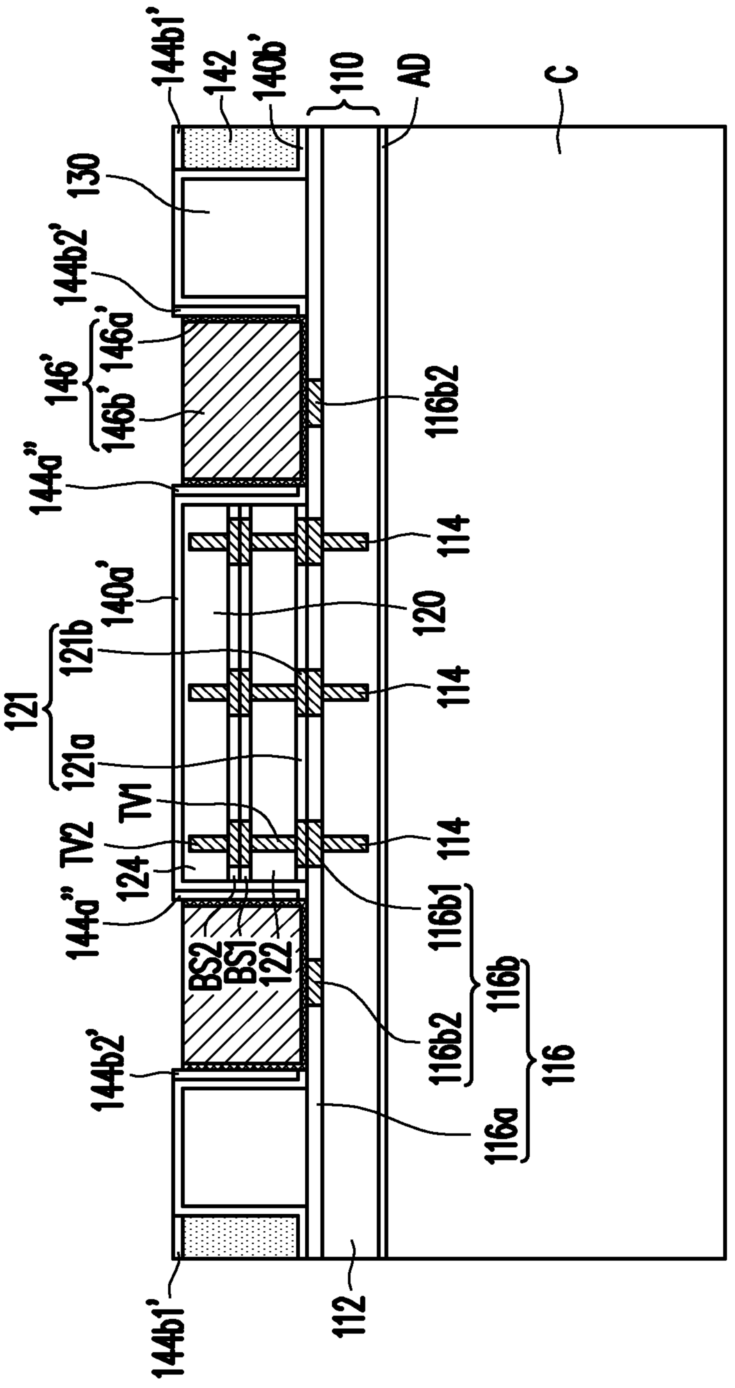

Referring to FIG. 11 and FIG. 12, after the carrier C and the adhesion layer AD are de-bonded from the bottom surface of the semiconductor wafer 110, a thinning process is performed from the bottom surface of the semiconductor wafer 110 to reduce the thickness of the semiconductor substrate 112 of the semiconductor wafer 110 until bottom ends of the conductive through vias 114 are revealed from the bottom surface of the semiconductor substrate 112. The above-mentioned thinning process may include a chemical mechanical polishing (CMP) process, a grinding process, an etching process, a combination thereof, or the like. In some other embodiments, the above-mentioned thinning process may be performed before mounting the semiconductor wafer 110 onto the carrier C.

A patterned dielectric layer 160 is formed over the bottom surface of the semiconductor wafer 110 such that the bottom ends of the conductive through vias 114 are revealed by openings formed in the patterned dielectric layer 160. The patterned dielectric layer 160 may be formed by high density plasma chemical vapor deposition (HDP-CVD), sub-atmosphere chemical vapor deposition (SACVD) or other deposition processes followed by a photolithography process. In some other embodiments, the material of the patterned dielectric filling material 142 may be or include non-photosensitive polyimide or the like. The patterned dielectric layer 160 may be or include silicon nitride, silicon dioxide, silicon oxynitride, combinations thereof, or the like, by any suitable method known in the art, such as chemical vapor deposition (CVD), plasma enhanced CVD (PECVD), a combination thereof, or the like.

After forming the patterned dielectric layer 160, conductive terminals 162 electrically connected to the conductive through vias 114 are formed over the patterned dielectric layer 160. In some embodiments, the conductive terminals 162 are controlled-collapse chip connection (C4) bumps or other suitable conductive terminals.

After forming the conductive terminals 162, a singulation process is performed along scribe lines SL such that singulated SoIC structures 100A are fabricated. The singulation process may be a blade sawing process. Based on the position of the scribe lines SL and the cutting width of the saw blade, portions of the patterned dielectric filling material 142 (shown in FIG. 11) may be cut and a patterned dielectric filling material 142' is formed to laterally encapsulate the thermal silicon substrates 130, as illustrated in FIG. 12. In some other embodiments, not illustrated in figures, after performing the singulation process, the sidewalls of the thermal silicon substrates 130 are revealed at the sidewalls of the singulated SoIC structure 100A.

As illustrate in FIG. 12, the SoIC structure 100A includes a semiconductor die 110', a semiconductor die 120, thermal silicon substrates 130 and an encapsulation is provided. The semiconductor die 120 is disposed on and electrically connected to the semiconductor die 110'. The thermal silicon substrates 130 are disposed on the semiconductor die 110', wherein the thermal silicon substrates 130 are laterally spaced apart from the semiconductor die 120. The encapsulation is disposed on the semiconductor die 110'. The encapsulation encapsulates the semiconductor die 120 and the thermal silicon substrates 130. The encapsulation includes a filling material layer and an insulator (e.g., an insulating capping layer). In the present embodiments, the metal layer 146' and the patterned dielectric filling material 142' collectively refer as the filling material layer of the encapsulation, while the insulating patterns 140*a*', 140*b*', 144*a*", 144*b*1' and 144*b*2' collectively refer as the insulator of the encapsulation. The metal layer 146' provides Electromagnetic Interference (EMI) shielding function which enhances performance of the semiconductor die 110' and/or the semiconductor die 120. Furthermore, the metal layer 146' may provide enhanced heat dissipation function. The filling material layer (e.g., the metal layer 146' and the patterned dielectric filling material 142') is disposed on the semiconductor die 110' and located between the semiconductor die 120 and thermal silicon substrates 130, and the filling material layer (e.g., the metal layer 146' and the patterned dielectric filling material 142') is spaced apart from the second semiconductor die 120 and the thermal silicon substrates 130 by the insulator (e.g., the insulating patterns 140*a*', 140*b*', 144*a*", 144*b*1' and 144*b*2'). The ratio of the height H of the semiconductor die 120 to the minimum distance D between the semiconductor die 120 and the thermal silicon substrates 130 ranges from about 0.015 to about 20.

The semiconductor die 110' includes a bonding structure 116. The semiconductor die 120 is disposed on the bonding structure 116 of the semiconductor die 110'. The semiconductor die 120 includes a bonding structure 121, and the semiconductor die 120 is electrically connected to the semiconductor die 110' through the bonding structure 116 and the bonding structure 121. The thermal silicon substrates 130 are disposed on the bonding structure 116 of the semiconductor die 110'.

In some embodiments, outer sidewalls of the encapsulation (i.e., outer sidewall of the patterned dielectric filling material 142') substantially align with sidewalls of the semiconductor die 110'.

The SoIC structure 100A may further include a bonding structure 154 and a support substrate 156, wherein the bonding structure 154 is disposed on the semiconductor die 120, the thermal silicon substrates 130 and the encapsulation. The support substrate 156 includes a bonding structure 158 disposed on the bonding structure 154, sidewalls of the bonding structures 154 and 158 substantially align with the outer sidewalls of the encapsulation, sidewalls of the semiconductor die 110' and sidewalls of the support substrate 156. In some embodiments, the thermal silicon substrates 130 include thermal vias TV3 in contact with the bonding structure 116.

FIG. 13 through FIG. 22 are cross-sectional views schematically illustrating a process flow for fabricating SoIC structures in accordance with some other embodiments of the present disclosure.

Referring to FIG. 13 through FIG. 22, the process flow for fabricating the SoIC structure 100B illustrated in FIG. 13 through FIG. 22 are similar to the process flow illustrated in FIG. 1 through FIG. 12 except that the redistribution wirings 148*a*, 148*b* and 148*c*, the dielectric layer 150, the conductive vias 152*a*, 152*b* and 152*c*, the bonding structures 154 and the bonding structures 158 illustrated in FIGS. 9-10 are omitted.

Figure 21:
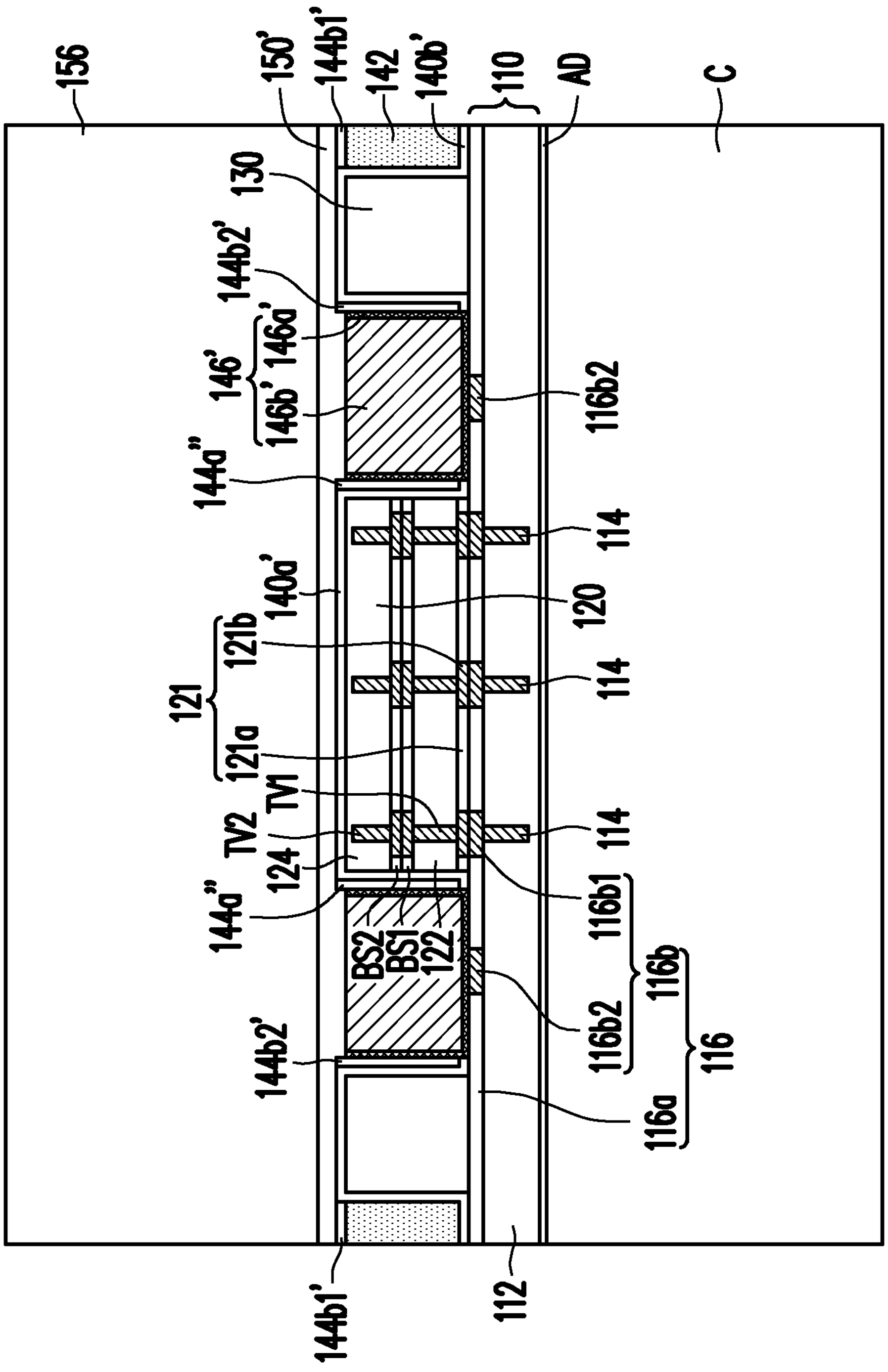

As illustrated in FIG. 21, a dielectric layer 150' is formed to cover the semiconductor die 120, the thermal silicon substrates 130 and the metal layer 146'. The dielectric layer 150' may be or include silicon nitride, silicon dioxide, silicon oxynitride, combinations thereof, or the like, by any suitable method known in the art, such as chemical vapor deposition (CVD), plasma enhanced CVD (PECVD), a combination thereof, or the like.

Figure 23:
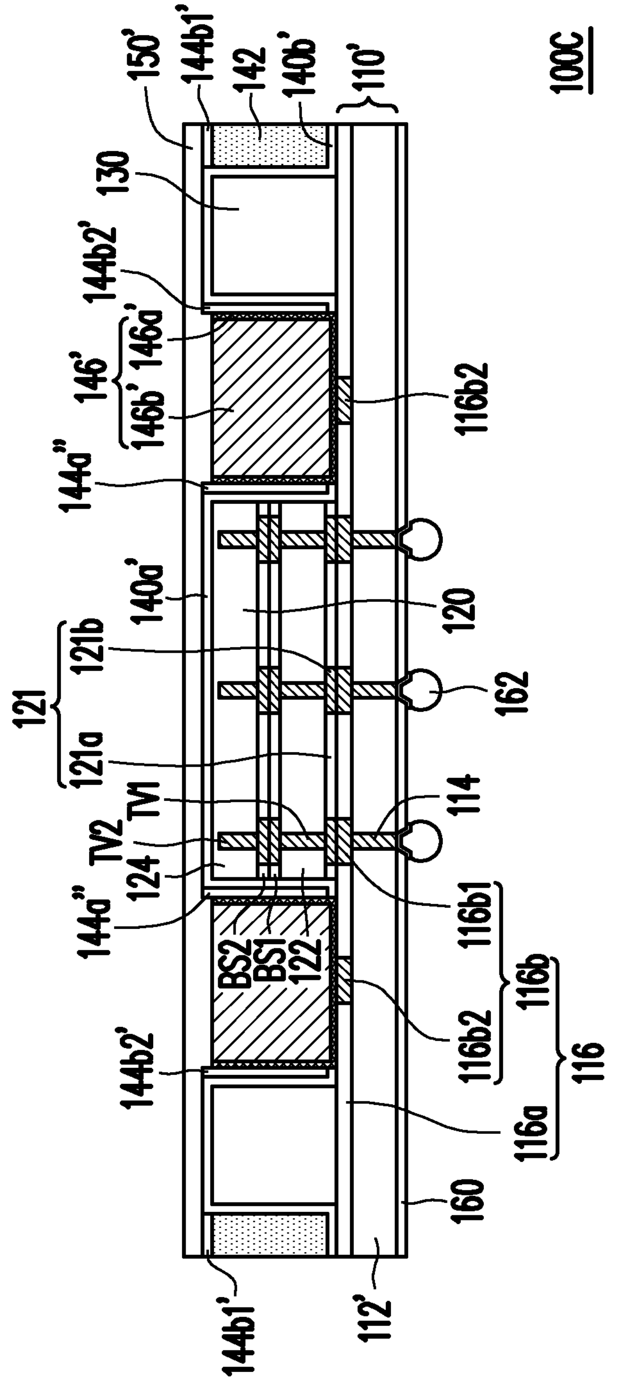
FIG. 23 is a cross-sectional view schematically illustrating a SoIC structure having no support substrate.

FIG. 23 is a cross-sectional view schematically illustrating a SoIC structure having no support substrate.

Figure 22:
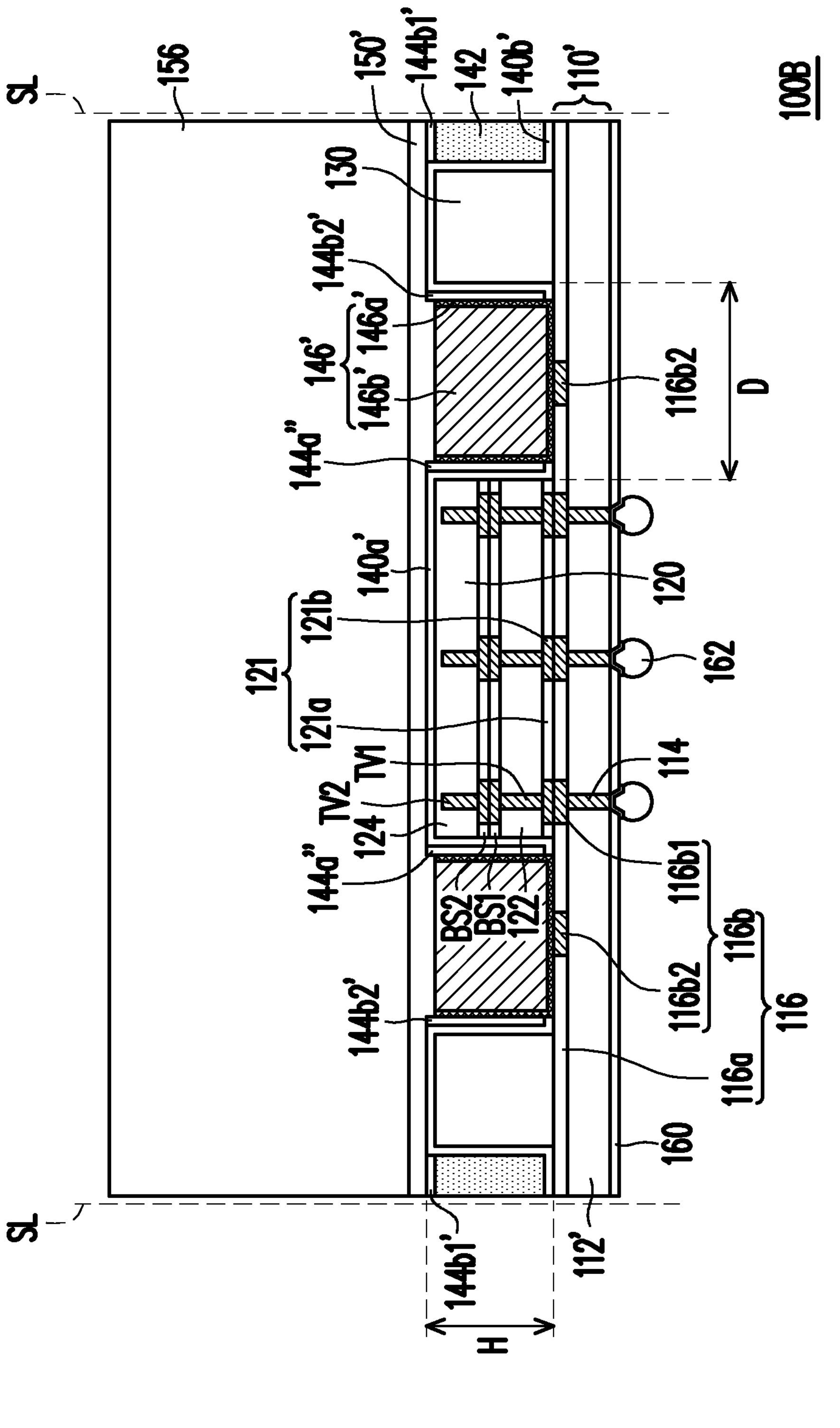

Referring to FIG. 22 and FIG. 23, the SoIC structure 100C illustrated in FIG. 23 is similar to the SoIC structure 100B illustrated in FIG. 22 except that there is no support substrate included in the SoIC structure 100C.

FIG. 24 through FIG. 31 are cross-sectional views schematically illustrating a process flow for fabricating SoIC structures in accordance with some alternative embodiments of the present disclosure.

Figure 24:
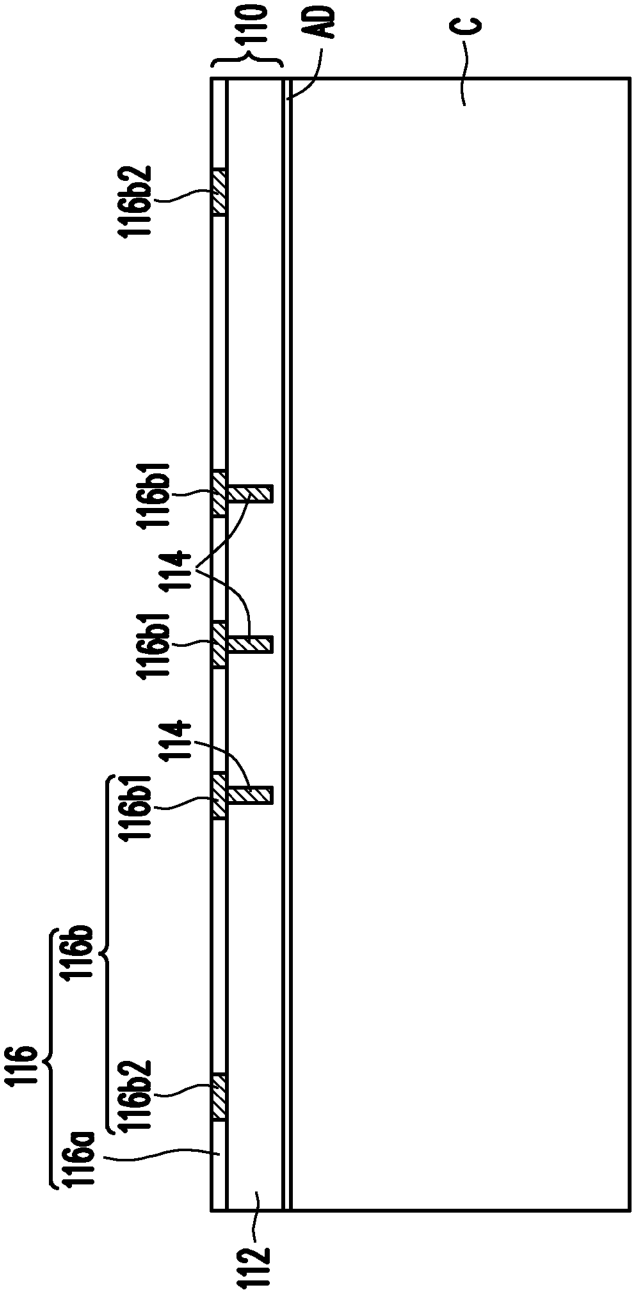
FIG. 24 through FIG. 31 are cross-sectional views schematically illustrating a process flow for fabricating SoIC structures in accordance with some alternative embodiments of the present disclosure.
Figure 25:
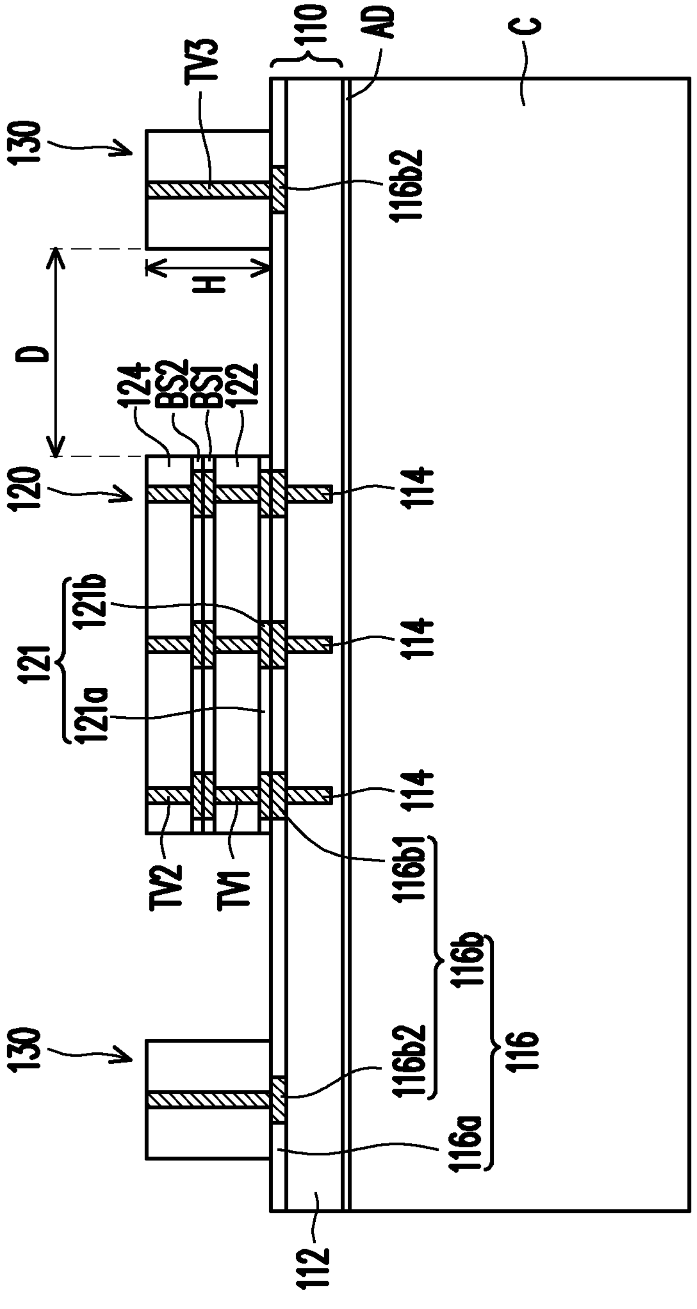
Figure 26:
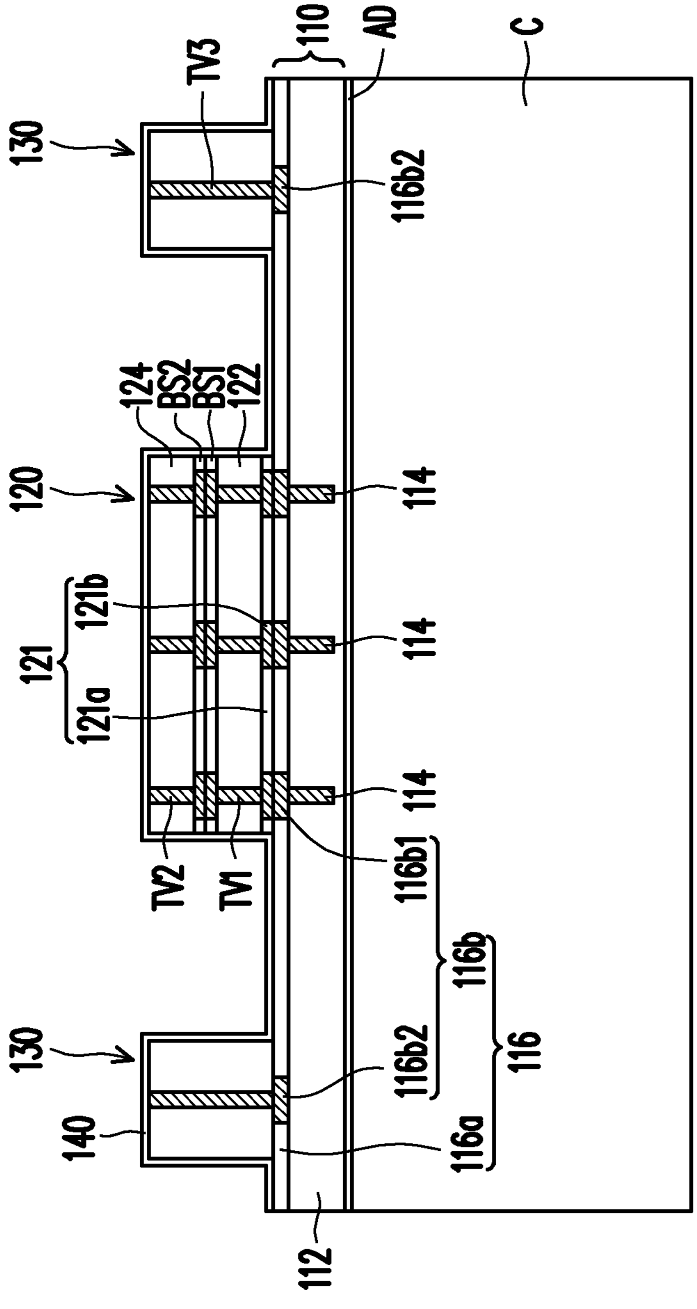

Referring to FIG. 24 through FIG. 26, the process flow illustrated in FIG. 24 through FIG. 26 is substantially identical to the process flow illustrated in FIG. 1 through FIG. 3.

Figure 27:
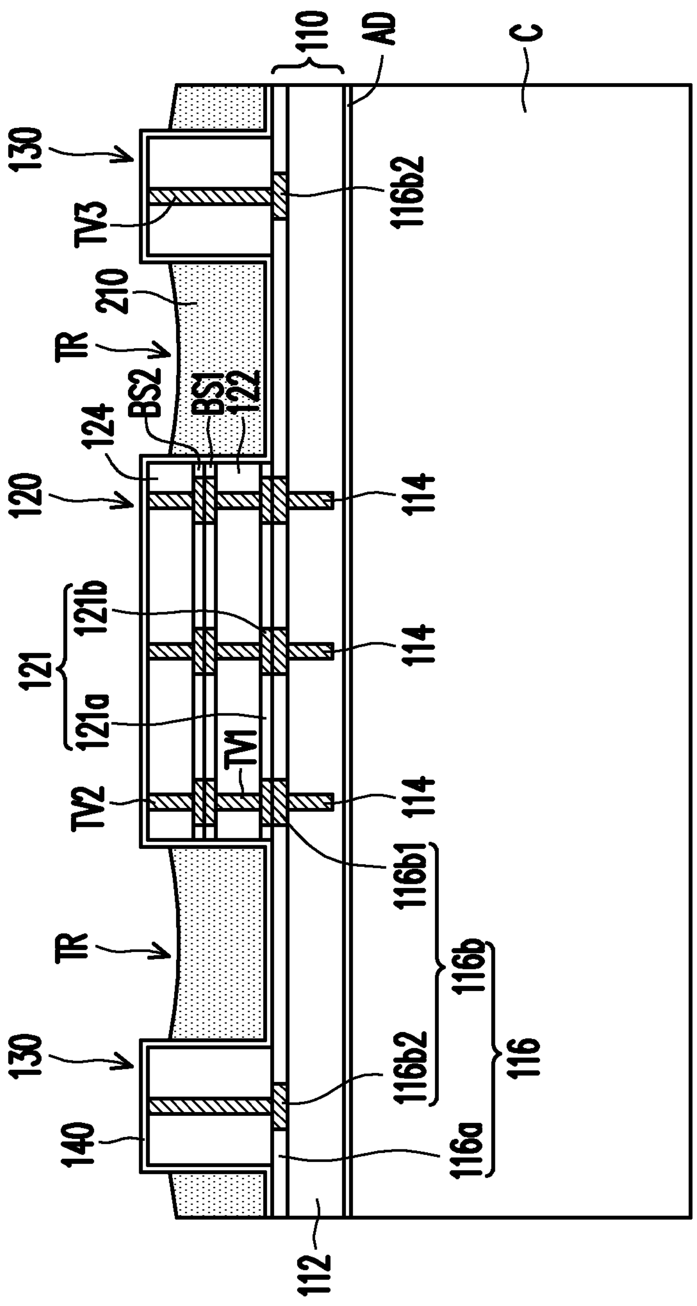
Figure 28:
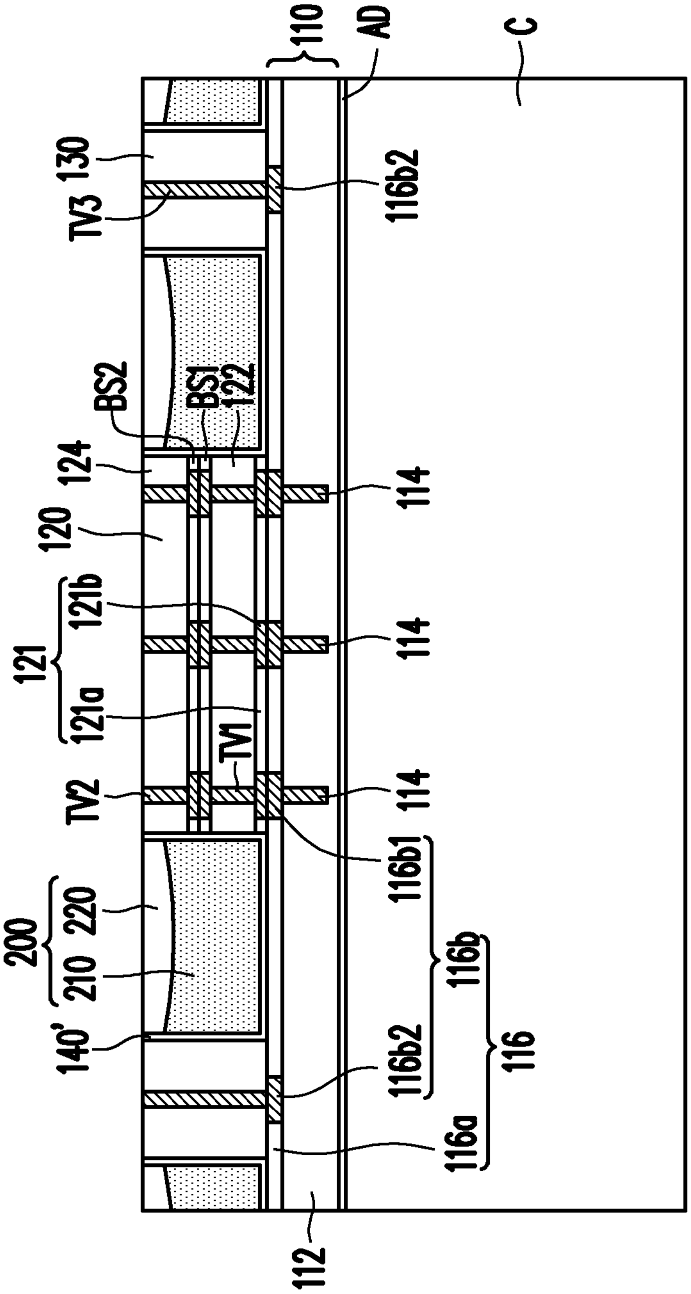

Referring to FIG. 27 and FIG. 28, a first filling material layer 210 of a filling material layer 200 is formed over the insulating layer 140 to fill trenches TR between the semiconductor die 120 and the thermal silicon substrates 130 as well as gaps between adjacent thermal silicon substrates 130. In some embodiments, a flowable filling material is applied on the insulating layer 140 to fill the trenches TR between the semiconductor die 120 and the thermal silicon substrates 130 as well as the gaps between adjacent thermal silicon substrates 130. The applied flowable filling material covers the semiconductor die 120, the thermal silicon substrates 130 and the insulating layer 140. The material of the flowable filling material may be or include polymer, underfill resin formed by dispensing or molding process. The flowable filling material may be cured. Then, the flowable filling material is partially removed such that the insulating layer 140 is revealed and recesses are formed between the semiconductor die 120 and the thermal silicon substrates 130. The removal process of the flowable filling material may be or include a chemical mechanical polishing (CMP) process, a grinding process, an etching process, a combination thereof, or the like. The depth of the recesses between the semiconductor die 120 and the thermal silicon substrates 130 may range from about 0.5 micrometer to about 5 micrometers.

After forming the first filling material layer 210, a second filling material layer 220 of the filling material layer 200 is formed to cover the first filling material layer 210 and the insulating layer 140. The second filling material layer 220 is formed over the first filling material layer 210 and the insulating layer 140 to fill the recesses between the semiconductor die 120 and the thermal silicon substrates 130. The second filling material layer 220 may be or include silicon nitride, silicon dioxide, silicon oxynitride, combinations thereof, or the like, by any suitable method known in the art, such as chemical vapor deposition (CVD), plasma enhanced CVD (PECVD), a combination thereof, or the like. Then, the second filling material layer 220 is partially removed until the semiconductor die 120 and the thermal silicon substrates 130 are revealed. During the removal process of the second filling material layer 220, the insulating layer 140 is partially removed such that a dielectric liner 140' is formed, wherein the dielectric liner at least covers sidewalls of the semiconductor die 120 and sidewalls of the thermal silicon substrates 130, and the first filling material layer 210 and the second filling material layer 220 are spaced apart from the semiconductor die 120 and the thermal silicon substrates 130 by the dielectric liner 140'. The removal process of the second filling material layer 220 may be or include a chemical mechanical polishing (CMP) process, a grinding process, an etching process, a combination thereof, or the like.

After performing the removal process of the second filling material layer 220, the recesses are filled by the first filling material layer 210, the second filling material layer 220 and the dielectric liner 140'. Since the filling material layer 200 including the first filling material layer 210 and the second filling material layer 220 are formed by multiple process steps, the roughness (Ra) of the top surface of the second filling material layer 220 may be minimized to be lower than about 10 angstroms. The top surface of the second filling material layer 220 may substantially level with the top surfaces of the semiconductor die 120 and the top surfaces of the thermal silicon substrates 130. Furthermore, the revealed top ends of the dielectric liner 140' may substantially level with the top surface of the semiconductor die 120, the top surfaces of the thermal silicon substrates 130 and the top surface of the second filling material layer 220. In an embodiment where the ratio of the height H of the semiconductor die 120 to the minimum distance D between the semiconductor die 120 and the thermal silicon substrates 130 ranges from about 0.015 to about 20, the second filling material layer 220 may have smooth top surface for subsequently performed processes (e.g., fabrication processes of a bonding structure 154 illustrated in FIG. 29). Furthermore, no void is generated in the first filling material layer 210 and the second filling material layer 220. Accordingly, reliability and yield rate of subsequently performed bonding process may be improved.

Figure 29:
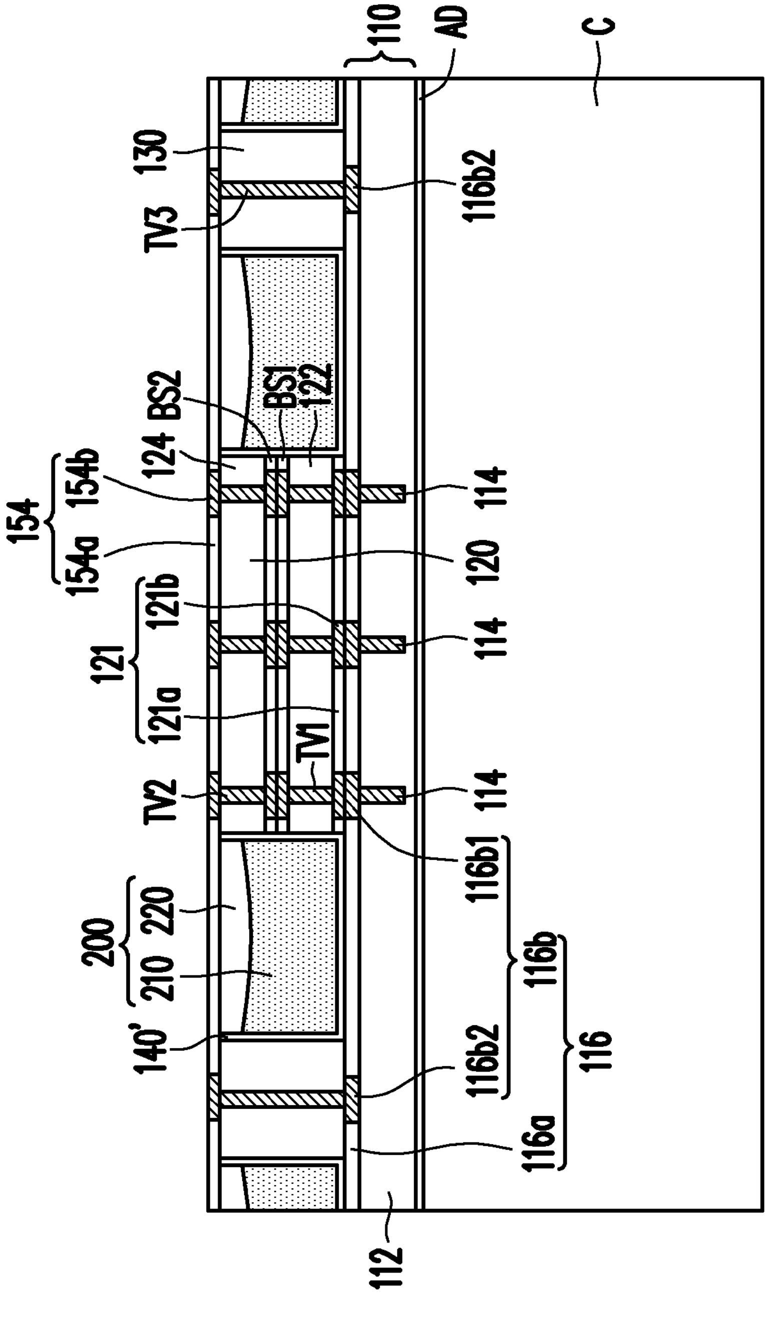

Referring to FIG. 29, a bonding structure 154 including a bonding dielectric layer 154*a* and bonding conductors 154*b* embedded in the bonding dielectric layer 154*a* is formed to cover the revealed top ends of the dielectric liner 140', top surface of the semiconductor die 120, the top surfaces of the thermal silicon substrates 130 as well as the top surface of the second filling material layer 220. The fabrication process and structure of the bonding structure 154 are described in accompany with FIG. 9. Thus, the detailed descriptions of the bonding structure 154 are omitted.

Figure 30:
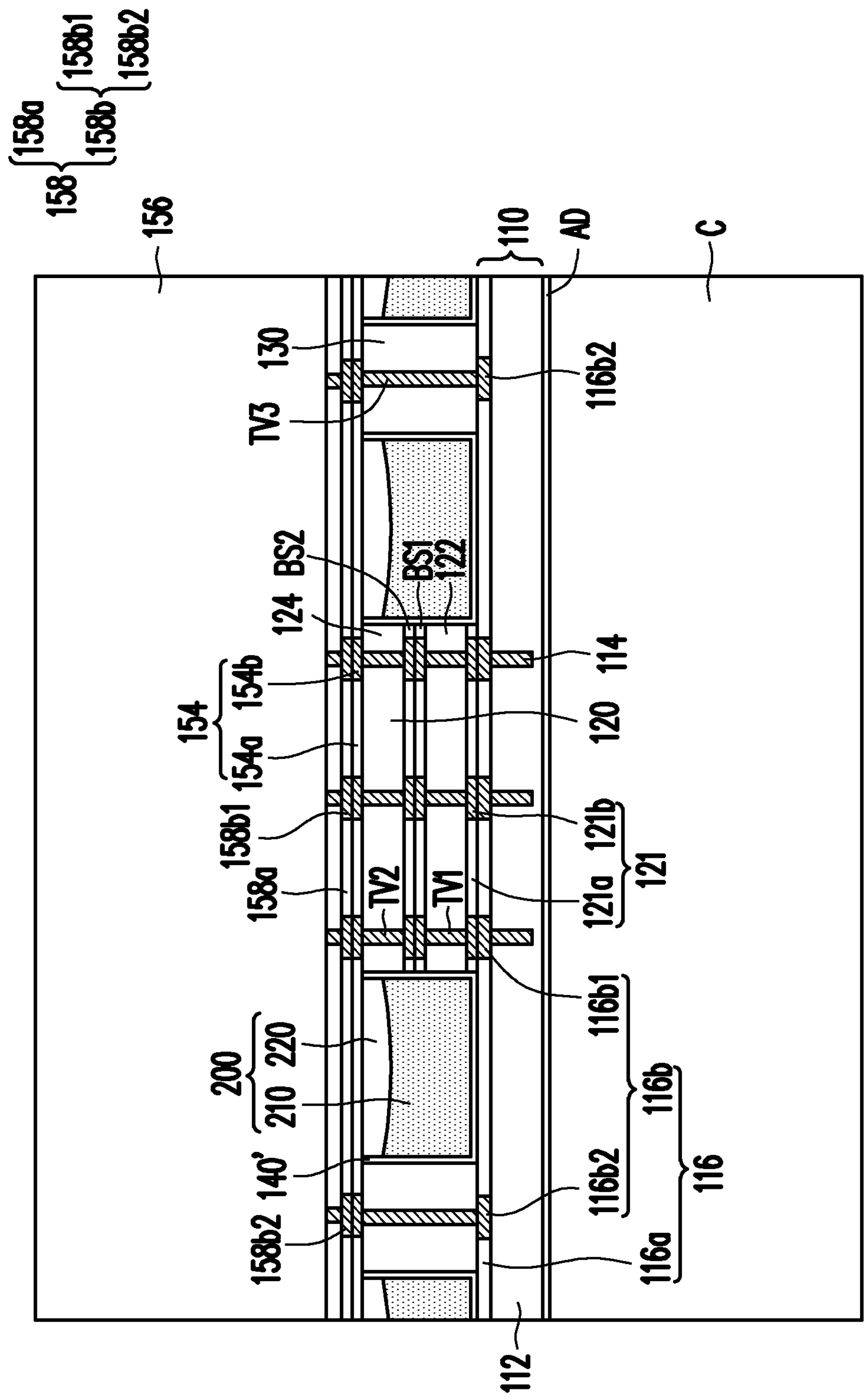

Referring to FIG. 30, a support substrate 156 including a bonding structure 158 formed thereon is provided, wherein the bonding structure 158 formed on the support substrate 156 may include a bonding dielectric layer 158*a* and bonding conductors 158*b* embedded in the bonding dielectric layer 158*a*. The support substrate 156 is bonded with the bonding structure 154 through the bonding structure 158. The fabrication process and structure of the bonding structure 158 and the support substrate 156 are described in accompany with FIG. 10. Thus, the detailed descriptions of the support substrate 156 and the bonding structure 158 are omitted.

Figure 31:
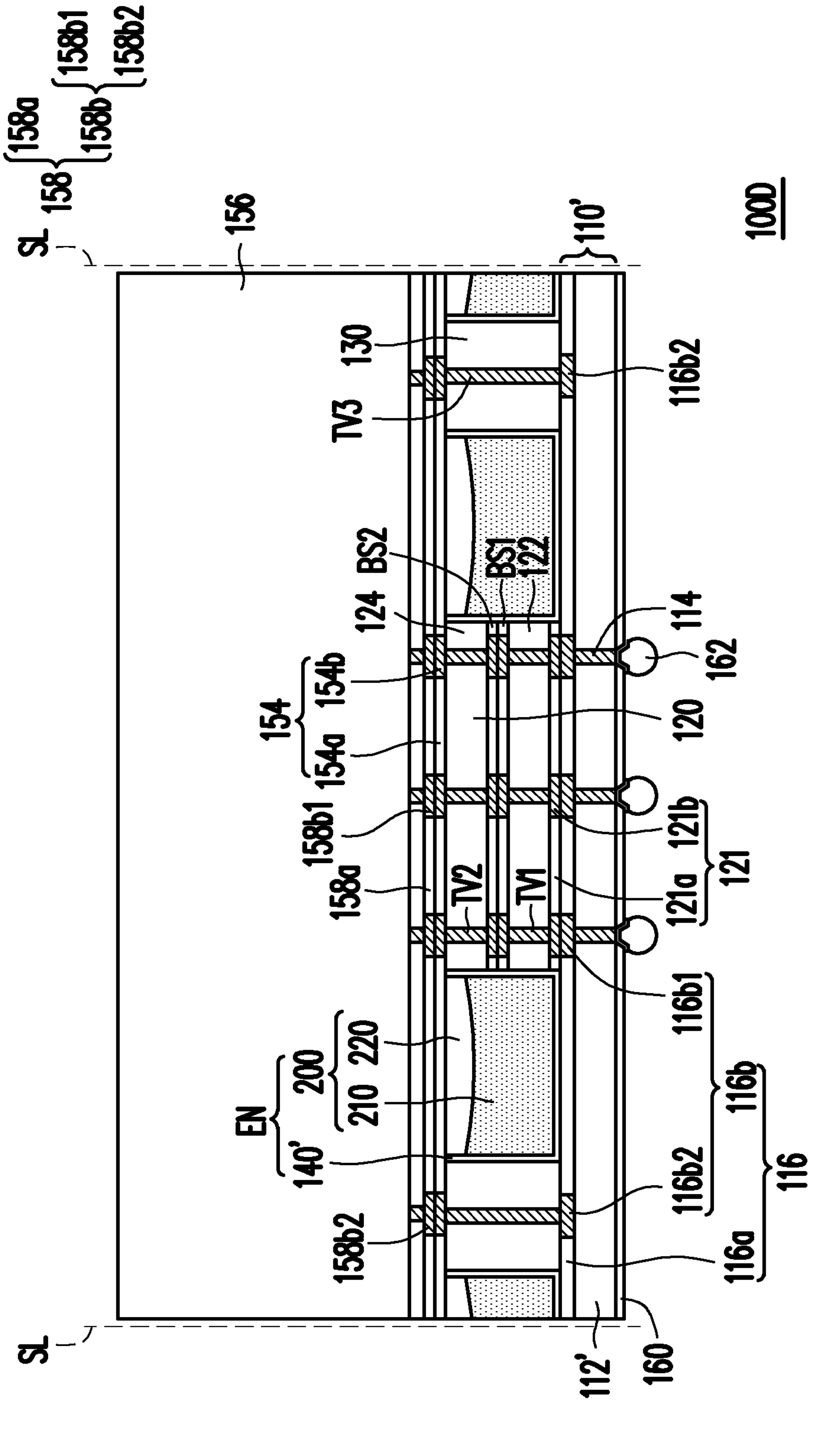
Figure 32:
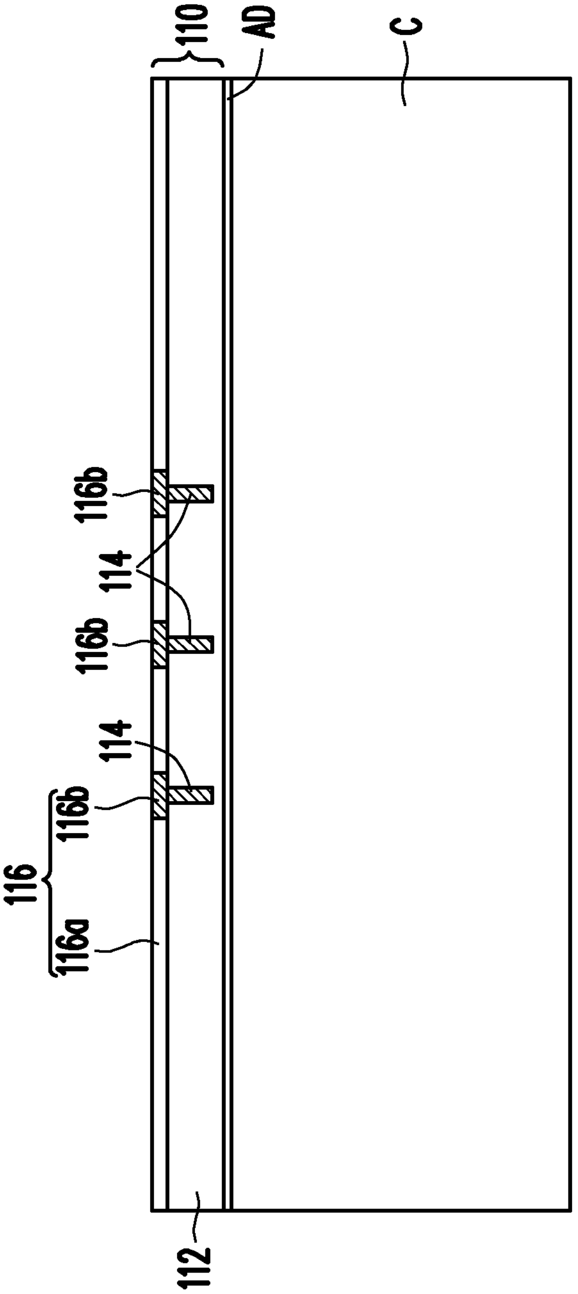
FIG. 32 through FIG. 39 are cross-sectional views schematically illustrating a process flow for fabricating SoIC structures in accordance with some yet other embodiments of the present disclosure.
Figure 33:
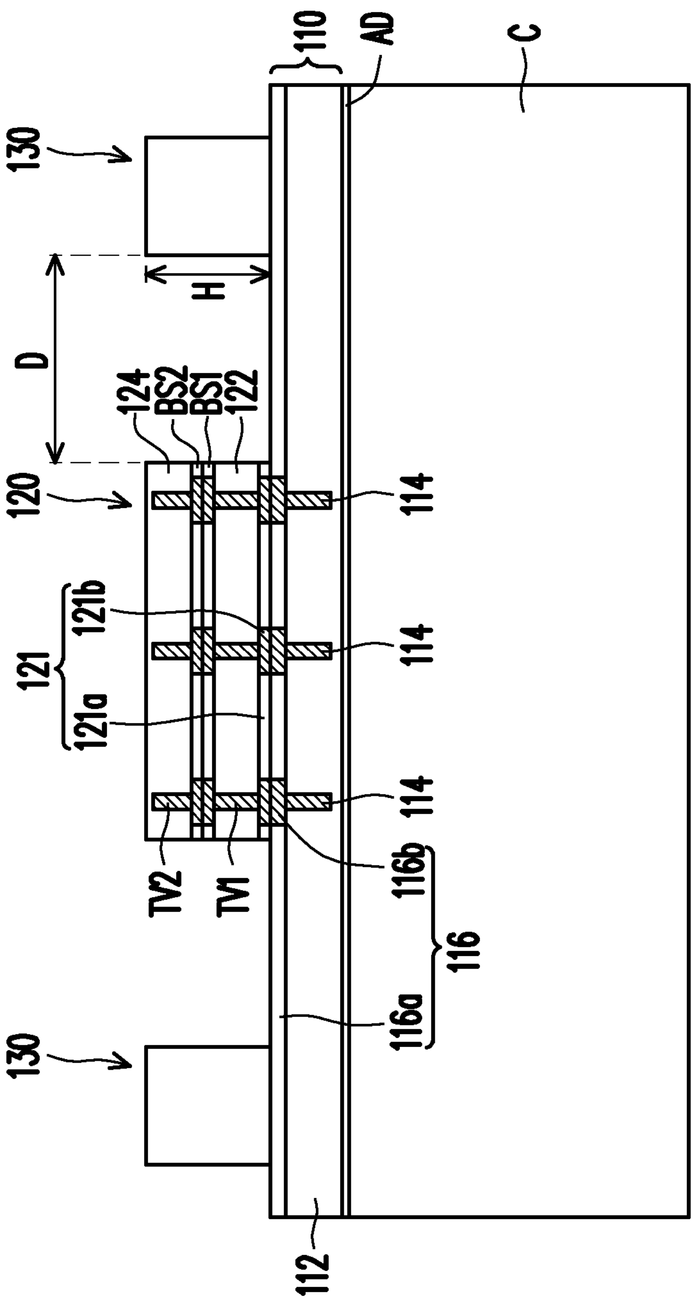
Figure 34:
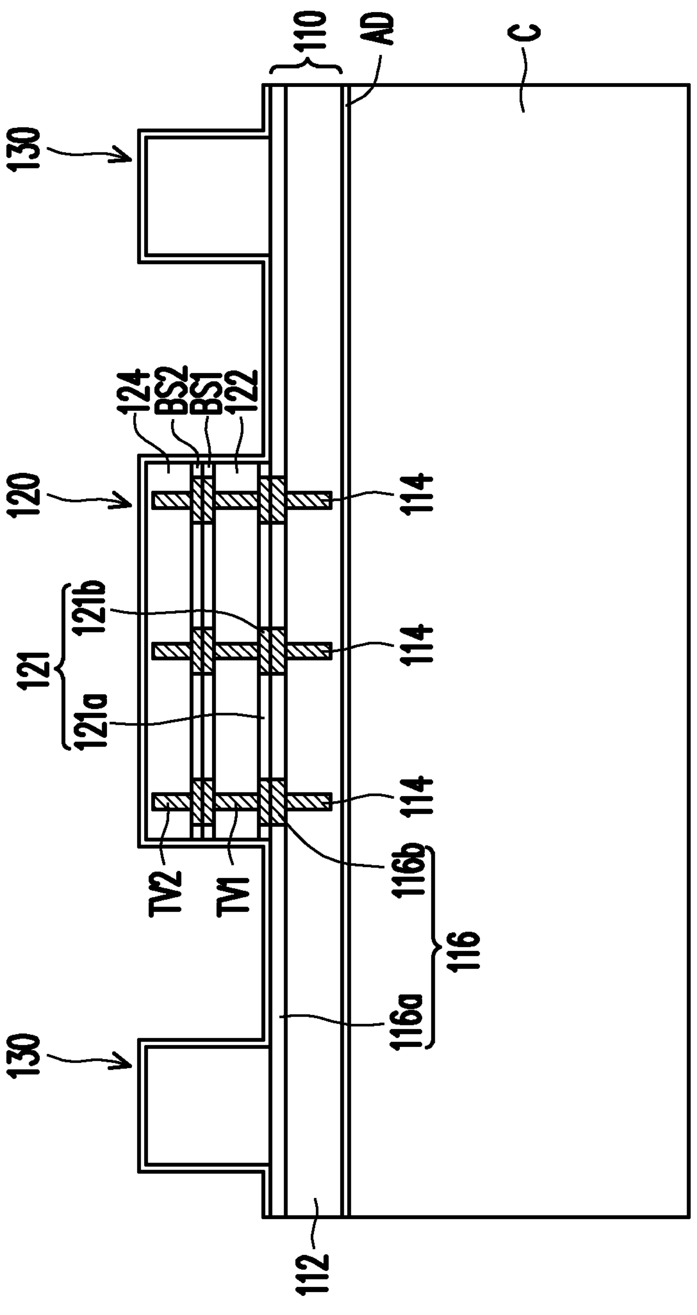
Figure 35:
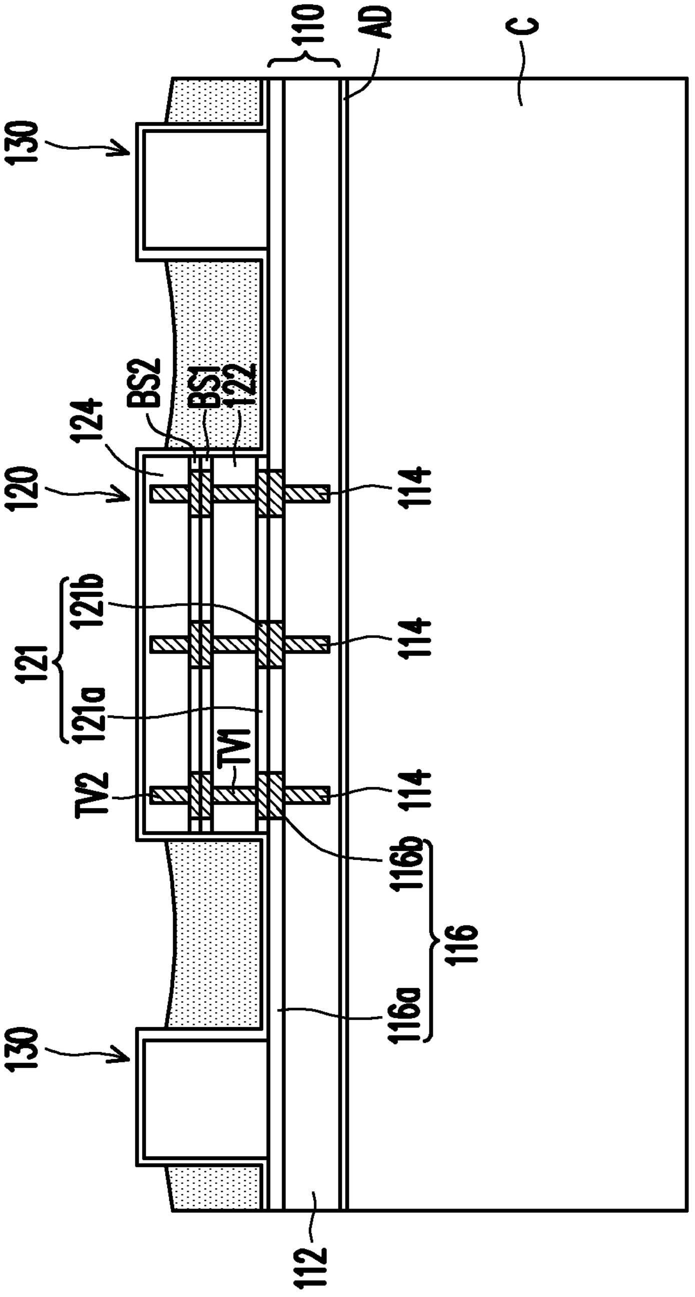
Figure 36:
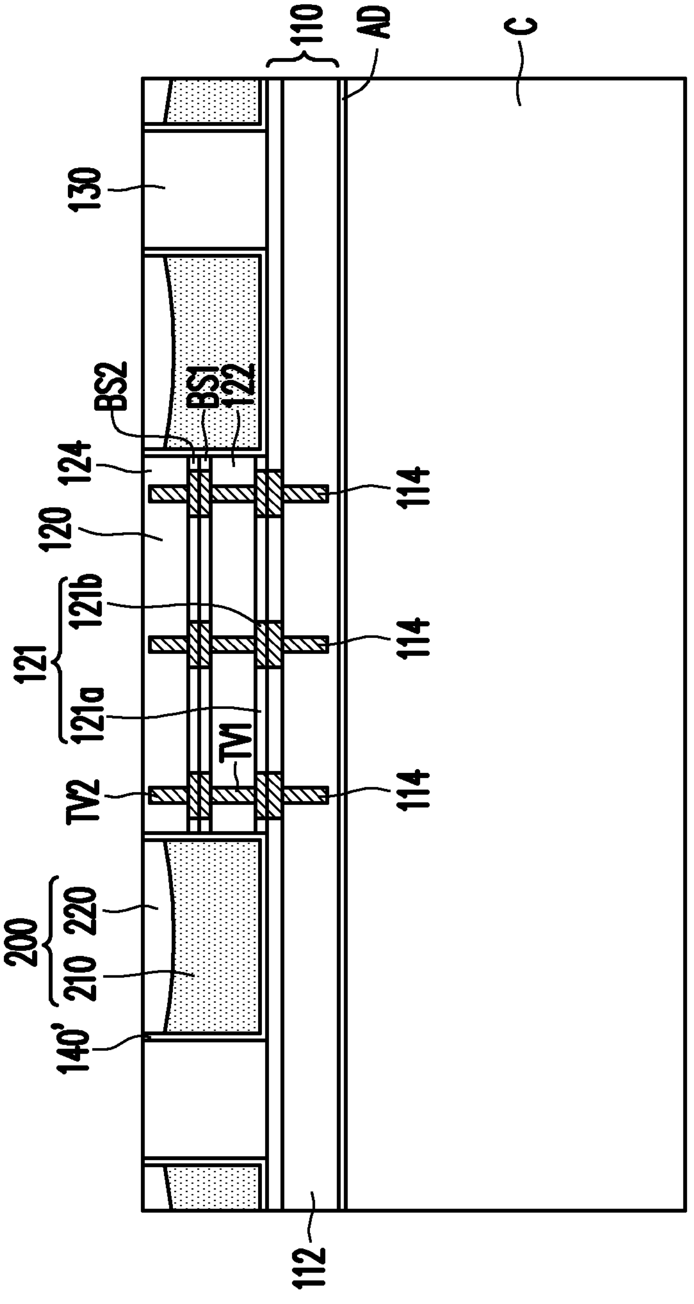

Referring to FIG. 31, the process flow for fabricating the SoIC structure 100D illustrated in FIG. 31 is substantially identical to the process flow illustrated in FIG. 11 and FIG. 12.

As illustrated in FIG. 31, the SoIC structure 100D includes a semiconductor die 100', a semiconductor die 120, thermal silicon substrates 130 and an encapsulation EN is provided. The semiconductor die 100' includes a bonding structure 116. The semiconductor die 120 is disposed on the bonding structure 116 of the semiconductor die 110'. The semiconductor die 120 includes a bonding structure 121. The semiconductor die 120 is electrically connected to the semiconductor die 110' through the bonding structure 116 and the bonding structure 121. The thermal silicon substrates 130 are disposed on the bonding structure 116 of the semiconductor die 110', and the thermal silicon substrates 130 are spaced apart from the semiconductor die 120. The encapsulation EN is disposed on the semiconductor die 110'. The encapsulation EN encapsulates the semiconductor die 120 and the thermal silicon substrates 130. The encapsulation EN includes a dielectric liner 140', a first filling material layer 210 and a second filling material layer 220. The dielectric liner 140' at least covers sidewalls of the semiconductor die 120 and sidewalls of the thermal silicon substrates 130. The first filling material layer 210 is disposed between the semiconductor die 120 and the thermal silicon substrates 130. The second filling material layer 220 covers the first filling material layer 210, wherein the first filling material layer 210 and the second filling material layer 220 are spaced apart from the semiconductor die 120 and the thermal silicon substrates 130 by the dielectric liner 140'. In some embodiments, a top surface of the second filling material layer 220 substantially levels with a top surface of the semiconductor die 120 and top surfaces of the thermal silicon substrates 130, and a sunken interface between the first filling material layer 210 and the second filling material layer 220 is lower than the top surface of the semiconductor die 120 and the top surfaces of the thermal silicon substrates 130. In some embodiments, the dielectric layer 140' further covers a portion of the bonding structure 161, and the first filling material layer 210 is spaced apart from the bonding structure 161 by the dielectric liner 140'. In some embodiments, outer sidewalls of the encapsulation EN substantially align with sidewalls of the semiconductor die 110'. In some embodiments, the SoIC structure 100D further includes a bonding structure 154 and a support substrate 156, wherein the bonding structure 156 is disposed on the semiconductor die 120, the thermal silicon substrates 130 and the encapsulation EN, outer sidewalls of the encapsulation EN substantially align with sidewalls of the semiconductor die 110', the support substrate 156 includes a bonding structure 158 disposed on the bonding structure 154, wherein sidewalls of the bonding structure 154 and the bonding structure 158 substantially align with the outer sidewalls of the encapsulation EN, sidewalls of the semiconductor die 110' and sidewalls of the support substrate 156. In some embodiments, the thermal silicon substrates 130 includes thermal vias TV3 in contact with the bonding structure 116.

FIG. 32 through FIG. 39 are cross-sectional views schematically illustrating a process flow for fabricating SoIC structures in accordance with some yet other embodiments of the present disclosure.

Referring to FIG. 32 through FIG. 39, the process flow for fabricating the SoIC structure 100E illustrated in FIG. 32 through FIG. 39 are similar to the process flow illustrated in FIG. 24 through FIG. 31 except that the bonding structures 154 and the bonding structures 158 illustrated in FIGS. 29-31 are omitted.

Figure 37:
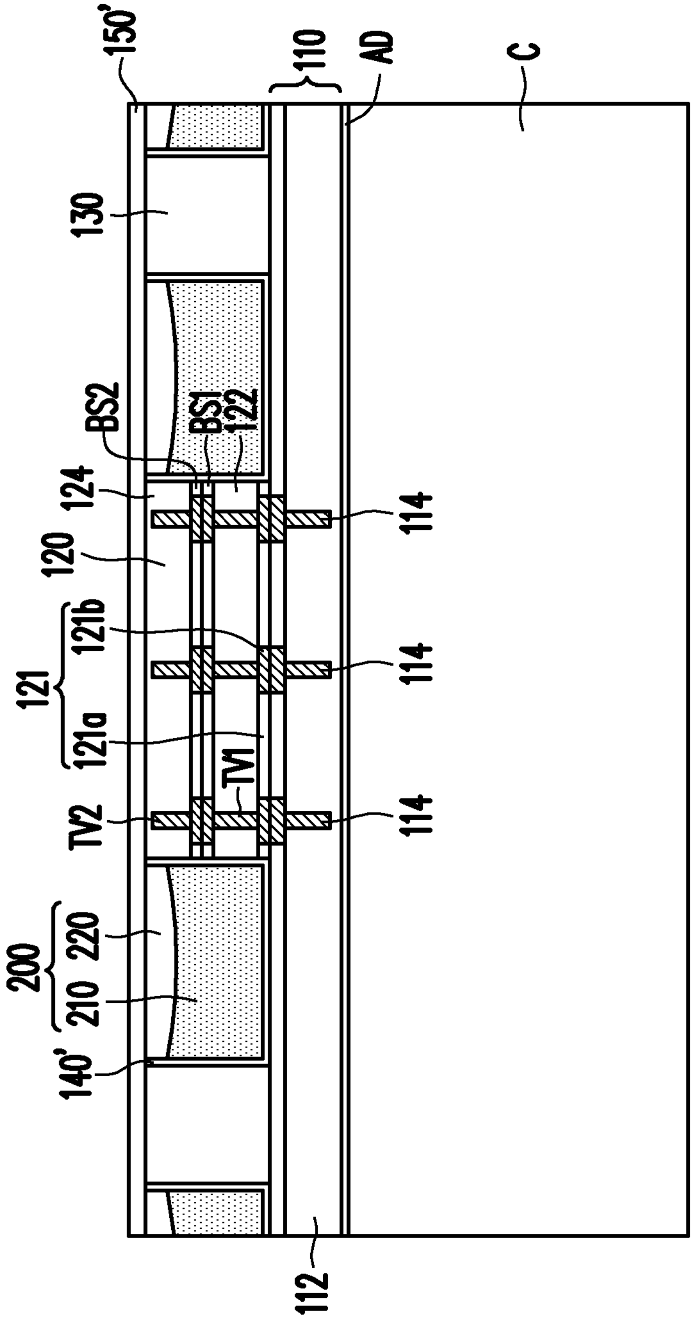
Figure 38:
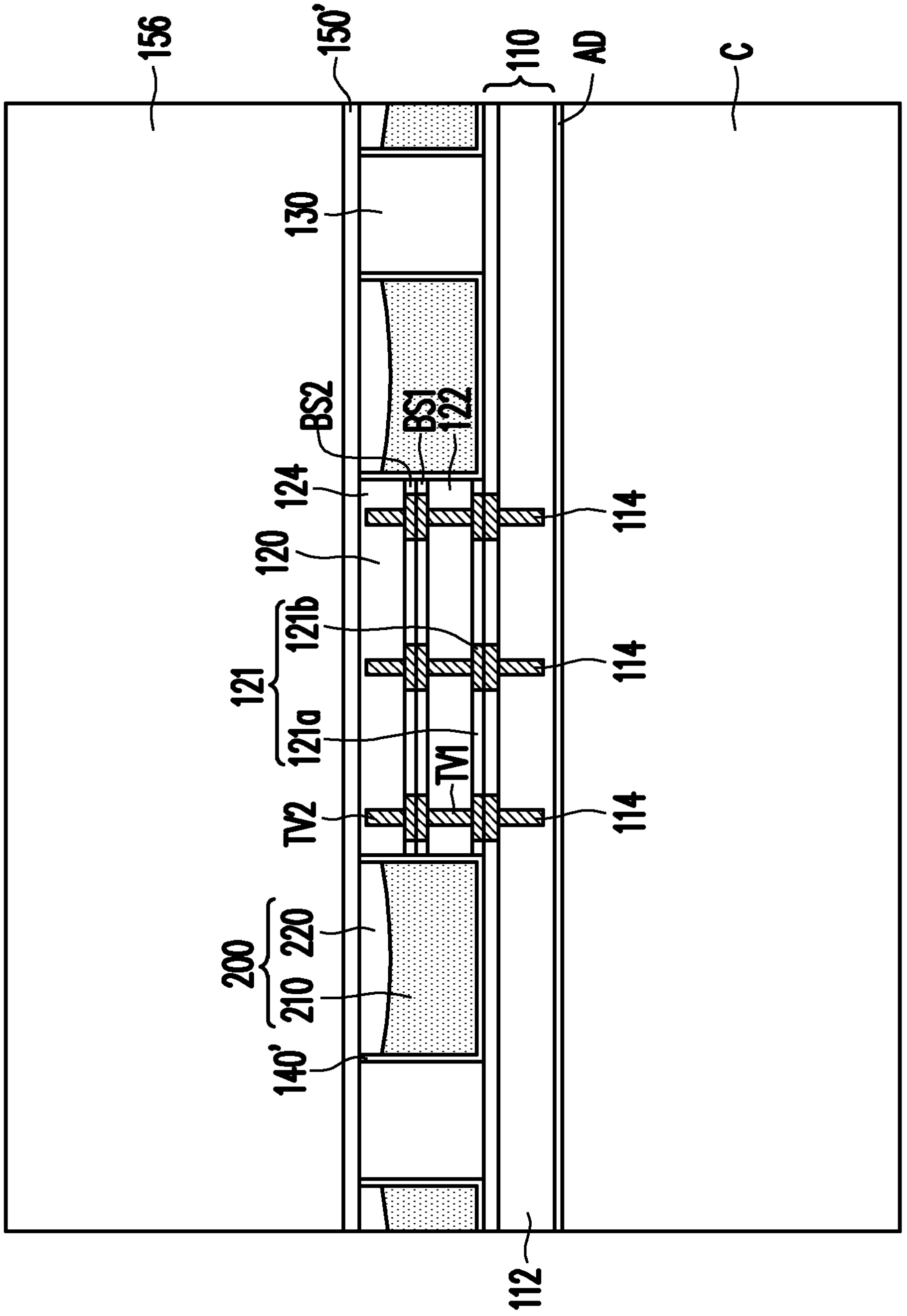

As illustrated in FIG. 37, a dielectric layer 150' is formed to cover the semiconductor die 120, the thermal silicon substrates 130, the first filling material layer 210 and the second filling material layer 220. The dielectric layer 150' may be or include silicon nitride, silicon dioxide, silicon oxynitride, combinations thereof, or the like, by any suitable method known in the art, such as chemical vapor deposition (CVD), plasma enhanced CVD (PECVD), a combination thereof, or the like.

Figure 40:
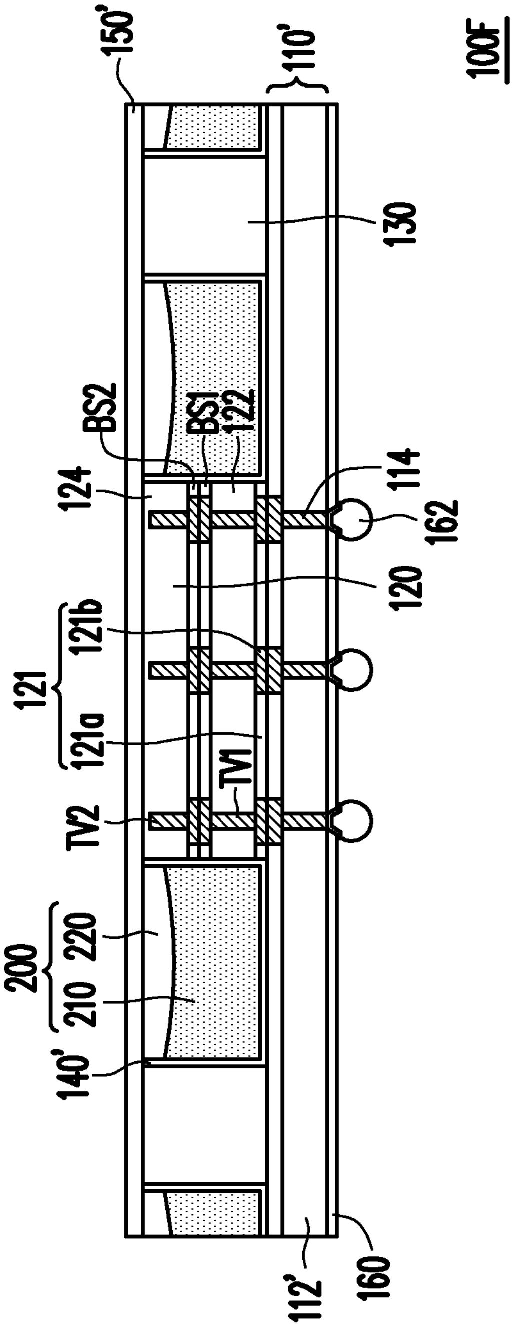
FIG. 40 is a cross-sectional view schematically illustrating a SoIC structure having no support substrate.

FIG. 40 is a cross-sectional view schematically illustrating a SoIC structure having no support substrate.

Figure 39:
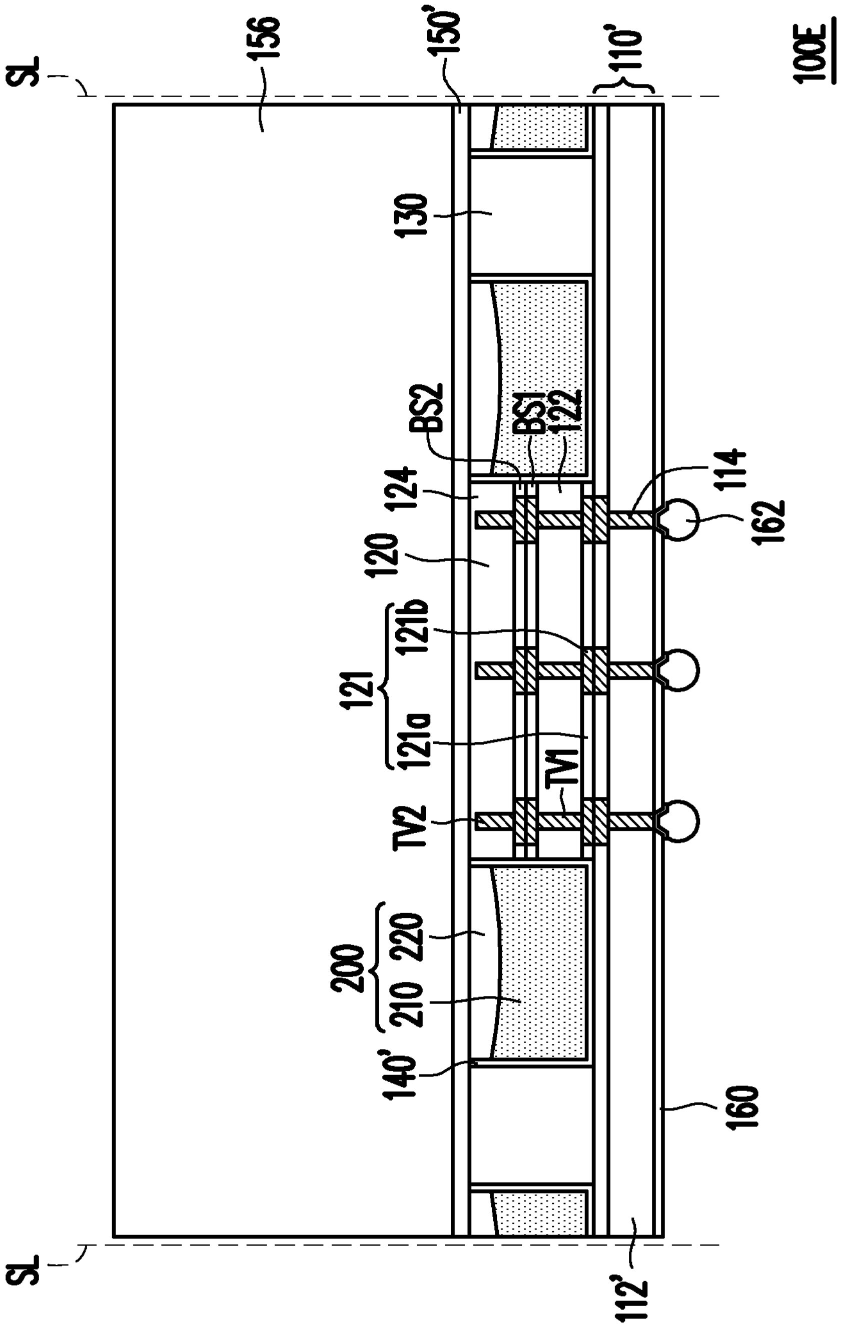

Referring to FIG. 39 and FIG. 40, the SoIC structure 100F illustrated in FIG. 40 is similar to the SoIC structure 100E illustrated in FIG. 39 except that there is no support substrate included in the SoIC structure 100F.

Figure 42:
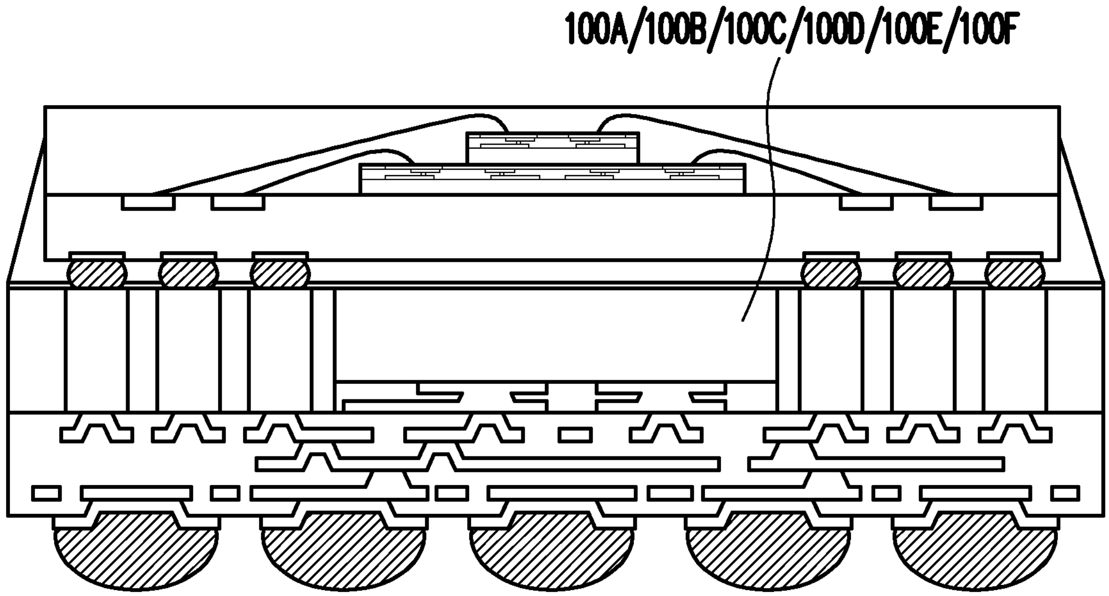
FIG. 42 is a cross-sectional view schematically illustrating an integrated fan-out (InFO) package including the above-mentioned semiconductor devices (i.e., the SoIC structures 100A, 100B, 100C, 100D, 100E and 100F).
Figure 43:
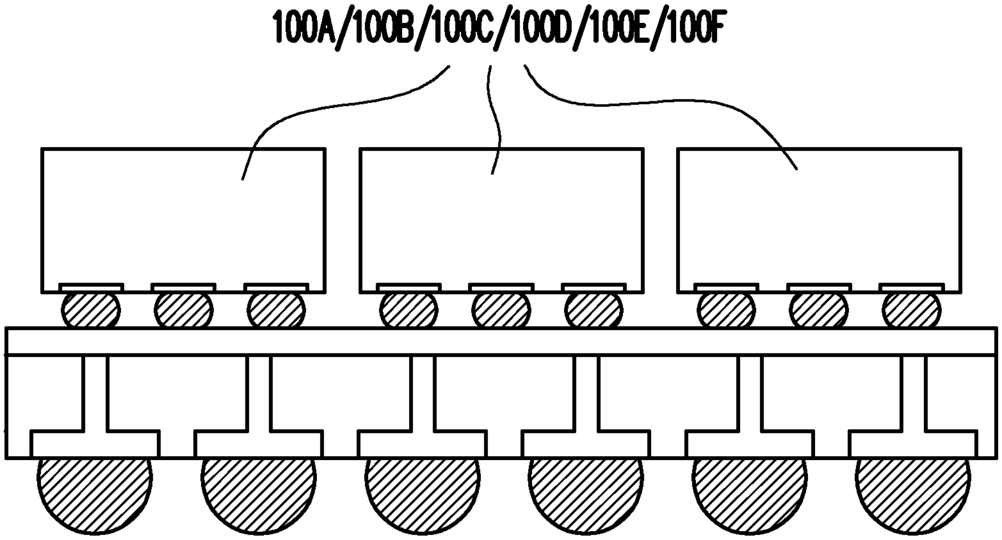
FIG. 43 is a cross-sectional view schematically illustrating a Chip-on-Wafer-on-Substrate (CoWoS) package including the above-mentioned semiconductor devices (i.e., the SoIC structures 100A, 100B, 100C, 100D, 100E and 100F).
Figure 44:
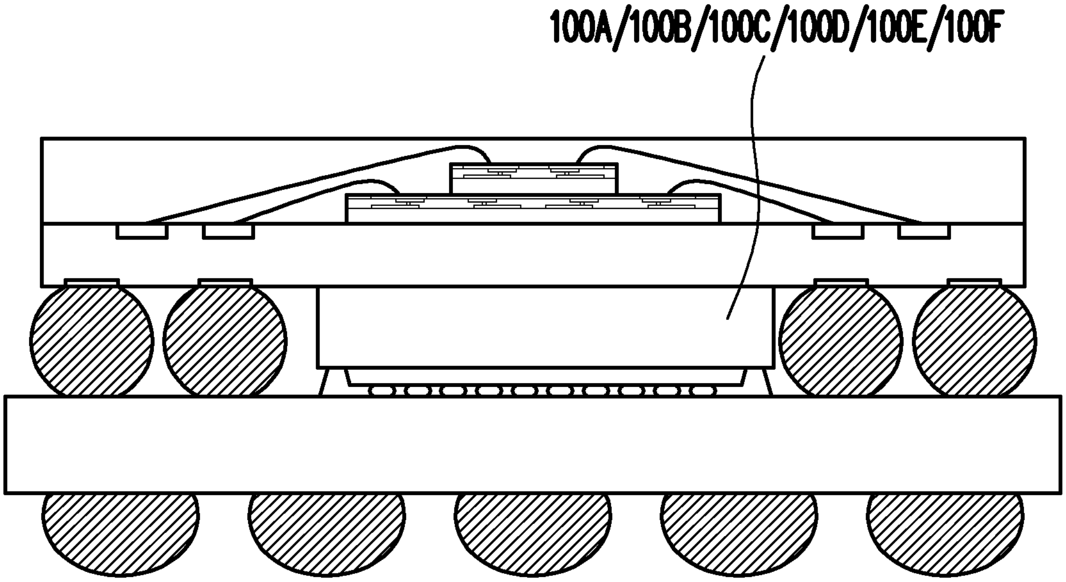
FIG. 44 is a cross-sectional view schematically illustrating a flip chip type package including the above-mentioned semiconductor devices (i.e., the SoIC structures 100A, 100B, 100C, 100D, 100E and 100F).

The above-mentioned semiconductor devices (i.e., the SoIC structures 100A, 100B, 100C, 100D, 100E and 100F) may be integrated into various packaging technology platforms such as integrated fan-out (InFO) technology illustrated in FIG. 42, Chip-on-Wafer-on-Substrate (CoWoS)

technology illustrated in FIG. 43 and flip chip technology illustrated in FIG. 44 to provide a miniaturized and highly integrated heterogeneous integration SiP for the future HPC, AI, 5G, and edge computing applications.

In the SoIC structures 100A, 100B and 100C, the metal layer 146' may provide EMI shielding function which enhances performance of the semiconductor die 110' and/or the semiconductor die 120. Furthermore, the metal layer 146' may provide enhanced heat dissipation function.

In the SoIC structures 100D, 100E and 100F, a substantial planar top surface of the second filling material layer 220 can be obtained, and the roughness (Ra) of the top surface of the second filling material layer 220 may be minimized to be lower than about 10 angstroms, which facilitates the subsequently performed processes.

In accordance with some embodiments of the disclosure, a semiconductor device including a first semiconductor die, a second semiconductor die, thermal silicon substrates and an encapsulation is provided. The second semiconductor die is disposed on and electrically connected to the first semiconductor die. The thermal silicon substrates are disposed on the first semiconductor die, wherein the thermal silicon substrates are spaced apart from the second semiconductor die. The encapsulation is disposed on the first semiconductor die. The encapsulation encapsulates the second semiconductor die and the thermal silicon substrates. The encapsulation includes a filling material layer and an insulator, wherein the filling material layer is disposed on the first semiconductor die and located between the second semiconductor die and thermal silicon substrates, and the filling material layer is spaced apart from the second semiconductor die and the thermal silicon substrates by the insulator. In some embodiments, a ratio of a height of the second semiconductor die to a minimum distance between the second semiconductor die and the thermal silicon substrates range from about 0.015 to about 20. In some embodiments, the filling material layer includes a metal layer, the insulator includes an insulating capping layer covering the second semiconductor die and the thermal silicon substrates, and sidewalls of the second semiconductor die and sidewalls of the thermal silicon substrates are spaced apart from the metal layer by the insulating capping layer. In some embodiments, the filling material layer includes a first filling material layer disposed between the second semiconductor die and the thermal silicon substrates; and a second filling material layer covering the first filling material layer, wherein the insulator includes a dielectric liner at least covering sidewalls of the second semiconductor die and sidewalls of the thermal silicon substrates, and the first and second filling material layers are spaced apart from the second semiconductor die and the thermal silicon substrates by the dielectric liner.

In accordance with some other embodiments of the disclosure, a semiconductor device including a first semiconductor die, a second semiconductor die, thermal silicon substrates and an encapsulation is provided. The first semiconductor die includes a first bonding structure. The second semiconductor die is disposed on the first bonding structure of the first semiconductor die. The second semiconductor die includes a second bonding structure, and the second semiconductor die is electrically connected to the first semiconductor die through the first bonding structure and the second bonding structure. The thermal silicon substrates are disposed on the first bonding structure of the first semiconductor die, wherein the thermal silicon substrates are spaced apart from the second semiconductor die. The encapsulation is disposed on the first semiconductor die. The encapsulation encapsulates the second semiconductor die and the thermal silicon substrates. The encapsulation includes a metal layer disposed on the first bonding structure; and an insulating capping layer covering the second semiconductor die and the thermal silicon substrates, wherein sidewalls of the second semiconductor die and sidewalls of the thermal silicon substrates are spaced apart from the metal layer by the insulating capping layer. In some embodiments, a top surface of the metal layer is substantially level with the top surfaces of the thermal silicon substrates and a top surface of the second semiconductor die. In some embodiments, the insulating capping layer includes a first insulating pattern, a second insulating pattern, third insulating patterns and fourth insulating patterns, wherein the first insulating pattern covers the top surface of the second semiconductor die and the sidewalls of the second semiconductor die, the second insulating pattern covers a portion of the first insulating pattern, the first insulating pattern is spaced apart from the metal layer by the second insulating pattern, the third insulating patterns cover the top surfaces of the thermal silicon substrates and the sidewalls of the thermal silicon substrates, the fourth insulating patterns cover portions of the third insulating patterns, and the third insulating patterns are spaced apart from the metal layer by the fourth insulating patterns. In some embodiments, outer sidewalls of the encapsulation substantially align with sidewalls of the first semiconductor die. In some embodiments, the semiconductor device further includes a third bonding structure and a support substrate, wherein the third bonding structure is disposed on the second semiconductor die, the thermal silicon substrates and the encapsulation, outer sidewalls of the encapsulation substantially align with sidewalls of the first semiconductor die, the support substrate includes a fourth bonding structure disposed on the third bonding structure, sidewalls of the third and fourth bonding structures substantially align with the outer sidewalls of the encapsulation, sidewalls of the first semiconductor die and sidewalls of the support substrate. In some embodiments, at least one dummy die among the thermal silicon substrates includes a thermal via in contact with the first bonding structure. In some embodiments, the first bonding structure includes a first bonding dielectric layer and first bonding conductors embedded in the first bonding dielectric layer, the second bonding structure includes a second bonding dielectric layer and second bonding conductors embedded in the second bonding dielectric layer, the third bonding structure includes a third bonding dielectric layer and third bonding conductors embedded in the third bonding dielectric layer, first signal transmission conductors among the first bonding conductors are electrically connected to second signal transmission conductors among the second bonding conductors, and first heat dissipation conductors among the first bonding conductors are connected to the metal layer. In some embodiments, the first heat dissipation conductors among the first bonding conductors are connected to a bottom end of the thermal via, and third heat dissipation conductors among the third bonding conductors are connected to a top end of the thermal via. In some embodiments, the fourth bonding structure includes a fourth bonding dielectric layer and fourth bonding conductors embedded in the fourth bonding dielectric layer, and fourth heat dissipation conductors among the fourth bonding conductors are connected to third heat dissipation conductors among the third bonding conductors. In some embodiments, the second semiconductor die includes stacked memory dies having a height greater than 20 micrometers.

In accordance with some other embodiments of the disclosure, a semiconductor device including a first semiconductor die, a second semiconductor die, thermal silicon substrates and an encapsulation is provided. The first semiconductor die includes a first bonding structure. The second semiconductor die is disposed on the first bonding structure of the first semiconductor die. The second semiconductor die includes a second bonding structure. The second semiconductor die is electrically connected to the first semiconductor die through the first bonding structure and the second bonding structure. The thermal silicon substrates are disposed on the first bonding structure of the first semiconductor die, and the thermal silicon substrates are spaced apart from the second semiconductor die. The encapsulation is disposed on the first semiconductor die. The encapsulation encapsulates the second semiconductor die and the thermal silicon substrates. The encapsulation includes a dielectric liner, a first filling material layer and a second filling material layer. The dielectric liner at least covers sidewalls of the second semiconductor die and sidewalls of the thermal silicon substrates. The first filling material layer is disposed between the second semiconductor die and the thermal silicon substrates. The second filling material layer covers the first filling material layer, wherein the first and second filling material layers are spaced apart from the second semiconductor die and the thermal silicon substrates by the dielectric liner. In some embodiments, a top surface of the second filling material layer substantially levels with a top surface of the second semiconductor die and top surfaces of the thermal silicon substrates, and a sunken interface between the first and second filling material layers is lower than the top surface of the semiconductor die and the top surfaces of the thermal silicon substrates. In some embodiments, the dielectric liner further covers a portion of the first bonding structure, and the first filling material layer is spaced apart from the first bonding structure by the dielectric liner. In some embodiments, outer sidewalls of the encapsulation substantially align with sidewalls of the first semiconductor die. In some embodiments, the semiconductor device further includes a third bonding structure and a support substrate, wherein the third bonding structure is disposed on the second semiconductor die, the thermal silicon substrates and the encapsulation, outer sidewalls of the encapsulation substantially align with sidewalls of the first semiconductor die, the support substrate includes a fourth bonding structure disposed on the third bonding structure, wherein sidewalls of the third bonding structure substantially align with the outer sidewalls of the encapsulation, sidewalls of the first semiconductor die and sidewalls of the support substrate. In some embodiments, at least one dummy die among the thermal silicon substrates includes a thermal via in contact with the first bonding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first semiconductor die;

a second semiconductor die disposed on and electrically connected to the first semiconductor die;

thermal silicon substrates disposed on the first semiconductor die, wherein the thermal silicon substrates are laterally spaced apart from each other, and the thermal silicon substrates are spaced apart from the second semiconductor die;

an encapsulation disposed on the first semiconductor die, the encapsulation encapsulating the second semiconductor die and the thermal silicon substrates, and the encapsulation comprising:

a filling material layer disposed on the first semiconductor die, wherein from a top view of the semiconductor device, the filling material layer surrounds the second semiconductor die and the thermal silicon substrates, the filling material layer comprises a patterned dielectric filling material, and the patterned dielectric filling material comprises portions extending between the thermal silicon substrates; and an insulator, wherein the filling material layer is spaced apart from the second semiconductor die and the thermal silicon substrates by the insulator.

2. The semiconductor device of claim 1, wherein a ratio of a height of the second semiconductor die to a minimum distance between the second semiconductor die and the thermal silicon substrates ranges from about 0.015 to about 20, and the thermal silicon substrates include thermal vias.

3. The semiconductor device of claim 1, wherein the filling material layer further comprises a metal layer surrounding the second semiconductor die, and the metal layer is surrounded by the filling material layer and the thermal silicon substrates.

4. The semiconductor device of claim 1, wherein the filling material layer comprises a first filling material layer disposed between the second semiconductor die and the thermal silicon substrates; and a second filling material layer covering the first filling material layer, wherein the insulator comprises a dielectric liner at least covering sidewalls of the second semiconductor die and sidewalls of the thermal silicon substrates, and the first and second filling material layers are spaced apart from the second semiconductor die and the thermal silicon substrates by the dielectric liner.

5. A semiconductor device, comprising:

a first semiconductor die comprising a first bonding structure;

a second semiconductor die disposed on the first bonding structure of the first semiconductor die, the second semiconductor die comprising a second bonding structure, and the second semiconductor die being electrically connected to the first semiconductor die through the first bonding structure and the second bonding structure;

thermal silicon substrates disposed on the first bonding structure of the first semiconductor die, wherein the thermal silicon substrates are spaced apart from the second semiconductor die, and the thermal silicon substrates are spaced apart from each other;

an encapsulation disposed on the first semiconductor die, the encapsulation encapsulating the second semiconductor die and the thermal silicon substrates, wherein the encapsulation comprises portions, the portions extend between the thermal silicon substrates, and the encapsulation comprises:

a metal layer disposed on the first bonding structure; and an insulating capping layer covering the second semiconductor die and the thermal silicon substrates, wherein sidewalls of the second semiconductor die and sidewalls of the thermal silicon substrates are spaced apart from the metal layer by the insulating capping layer.

6. The semiconductor device of claim 5, wherein a top surface of the metal layer is substantially level with the top surfaces of the thermal silicon substrates and a top surface of the second semiconductor die.

7. The semiconductor device of claim 5, wherein the insulating capping layer comprises:

a first insulating pattern covering the top surface of the second semiconductor die and the sidewalls of the second semiconductor die;

a second insulating pattern covering a portion of the first insulating pattern, wherein the first insulating pattern is spaced apart from the metal layer by the second insulating pattern;

third insulating patterns covering the top surfaces of the thermal silicon substrates and the sidewalls of the thermal silicon substrates; and fourth insulating patterns covering portions of the third insulating patterns, wherein the third insulating patterns are spaced apart from the metal layer by the fourth insulating patterns.

8. The semiconductor device of claim 5, wherein outer sidewalls of the encapsulation substantially align with sidewalls of the first semiconductor die.

9. The semiconductor device of claim 6 further comprising:

a third bonding structure disposed on the second semiconductor die, the thermal silicon substrates and the encapsulation, wherein outer sidewalls of the encapsulation substantially align with sidewalls of the first semiconductor die; and a support substrate comprising a fourth bonding structure disposed on the third bonding structure, wherein sidewalls of the third and fourth bonding structures substantially align with the outer sidewalls of the encapsulation, the sidewalls of the first semiconductor die and sidewalls of the support substrate.

10. The semiconductor device of claim 9, wherein at least one dummy die among the thermal silicon substrates comprises a thermal via in contact with the first bonding structure.

11. The semiconductor device of claim 10, wherein the first bonding structure comprises a first bonding dielectric layer and first bonding conductors embedded in the first bonding dielectric layer, the second bonding structure comprises a second bonding dielectric layer and second bonding conductors embedded in the second bonding dielectric layer, the third bonding structure comprises a third bonding dielectric layer and third bonding conductors embedded in the third bonding dielectric layer, first signal transmission conductors among the first bonding conductors are electrically connected to second signal transmission conductors among the second bonding conductors, and first heat dissipation conductors among the first bonding conductors are connected to the metal layer.

12. The semiconductor device of claim 11, wherein the first heat dissipation conductors among the first bonding conductors are connected to a bottom end of the thermal via, and third heat dissipation conductors among the third bonding conductors are connected to a top end of the thermal via.

13. The semiconductor device of claim 11, wherein the fourth bonding structure comprises a fourth bonding dielectric layer and fourth bonding conductors embedded in the fourth bonding dielectric layer, and fourth heat dissipation conductors among the fourth bonding conductors are connected to third heat dissipation conductors among the third bonding conductors.

14. The semiconductor device of claim 5, wherein the second semiconductor die comprises stacked memory dies having a height greater than 20 micrometers.

15. A semiconductor device, comprising:

a first semiconductor die;

a second semiconductor die disposed on the first semiconductor die, the second semiconductor die being electrically connected to the first semiconductor die through a first bonding interface;

a thermal silicon substrate disposed on the first semiconductor die, wherein the thermal silicon substrate is spaced apart from the second semiconductor die by the first bonding interface;

an encapsulation disposed on the first semiconductor die, the encapsulation encapsulating the second semiconductor die and the thermal silicon substrate, wherein the encapsulation comprising:

a filling material layer disposed on the first semiconductor die and located between the second semiconductor die and thermal silicon substrate, wherein from a top view of the semiconductor device, the filling material layer surrounds the second semiconductor die and the thermal silicon substrate, the filling material layer comprises portions, and the portions extends between the thermal silicon substrates;

an insulator, wherein the filling material layer is spaced apart from the second semiconductor die and the thermal silicon substrate by the insulator; and a second bonding interface covering the second semiconductor die and the encapsulation.

16. The semiconductor device of claim 15, wherein the thermal silicon substrate comprises a through via.

17. The semiconductor device of claim 15 further comprising redistribution wirings disposed on and electrically connected to the second semiconductor die.

18. The semiconductor device of claim 15 further comprising redistribution wirings disposed on the second semiconductor die and the thermal silicon substrate.

19. The semiconductor device of claim 15 further comprising redistribution wirings disposed on the second semiconductor die, the encapsulation and the thermal silicon substrate.

20. The semiconductor device of claim 15, wherein the second bonding interface comprises two bonding structures.

* * * * *